United States Patent
Abe et al.

(10) Patent No.: US 11,969,975 B2
(45) Date of Patent: Apr. 30, 2024

(54) PROTECTIVE COVER MEMBER AND MEMBER SUPPLYING SHEET INCLUDING THE SAME

(71) Applicant: NITTO DENKO CORPORATION, Osaka (JP)

(72) Inventors: Yuichi Abe, Osaka (JP); Tomohiro Kontani, Osaka (JP); Takeo Inoue, Osaka (JP); Bunta Hirai, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 42 days.

(21) Appl. No.: 17/626,334

(22) PCT Filed: Jul. 3, 2020

(86) PCT No.: PCT/JP2020/026307
§ 371 (c)(1),
(2) Date: Jan. 11, 2022

(87) PCT Pub. No.: WO2021/010197
PCT Pub. Date: Jan. 21, 2021

(65) Prior Publication Data
US 2022/0266575 A1   Aug. 25, 2022

(30) Foreign Application Priority Data

Jul. 12, 2019  (JP) .................................. 2019-130285
Feb. 12, 2020  (JP) .................................. 2020-021525

(51) Int. Cl.
*B32B 27/08* (2006.01)
*B32B 7/12* (2006.01)
(Continued)

(52) U.S. Cl.
CPC ................ *B32B 27/08* (2013.01); *B32B 7/12* (2013.01); *B32B 27/281* (2013.01);
(Continued)

(58) Field of Classification Search
CPC .... H04R 1/023; H04R 1/086; H04R 2499/11; H04R 1/44; H04R 1/00; H04R 1/02;
(Continued)

(56) References Cited

U.S. PATENT DOCUMENTS 6,512,834 B1    1/2003  Banter et al.
2005/0074606 A1  4/2005  Nishiyama et al.
(Continued)

FOREIGN PATENT DOCUMENTS

JP   2003-503991    1/2003
JP   2003-313516   11/2003
(Continued)

OTHER PUBLICATIONS

Written Opinion issued in International Application No. PCT/JP2020/026307, dated Sep. 15, 2020, along with an English translation thereof.
(Continued)

*Primary Examiner* — Alicia J Weydemeyer
(74) *Attorney, Agent, or Firm* — GREENBLUM & BERNSTEIN, P.L.C.

(57) ABSTRACT

A protective cover member includes a laminate including: a protective membrane having a shape configured to cover an opening when the protective cover member is placed on the face of an object; a substrate film joined to the protective membrane; and a first adhesive layer configured to fix the protective cover member to the face, wherein an outer peripheral surface of the protective cover member has a step in a laminating direction of the laminate, a first portion of the protective cover member protrudes at the step more outward than a second portion of the protective cover member does when the protective cover member is placed on the face, the first portion being positioned farther from the face than the step, the second portion being positioned closer to the face than the step, and the protective membrane and the substrate film are positioned in the first portion.

18 Claims, 14 Drawing Sheets

(51) Int. Cl.
- *B32B 27/28* (2006.01)
- *B32B 27/32* (2006.01)
- *B81B 7/00* (2006.01)

(52) U.S. Cl.
CPC ...... *B32B 27/322* (2013.01); *B32B 2307/306* (2013.01); *B32B 2307/584* (2013.01); *B32B 2307/724* (2013.01); *B81B 7/0038* (2013.01)

(58) Field of Classification Search
CPC .............. H04R 1/1016; H04R 2207/00; H04R 25/654; H04R 25/658; H04R 7/04; H04R 1/20; H04R 1/22; H04R 1/32
See application file for complete search history.

(56) References Cited

U.S. PATENT DOCUMENTS

| | | |
|---|---|---|
| 2009/0268928 A1 | 10/2009 | Ikeyama et al. |
| 2010/0206660 A1 | 8/2010 | Horie et al. |
| 2011/0117304 A1* | 5/2011 | Ueki .................. H04R 1/023 156/247 |
| 2013/0156985 A1 | 6/2013 | Karube et al. |
| 2014/0079268 A1 | 3/2014 | Karube et al. |

FOREIGN PATENT DOCUMENTS

| | | |
|---|---|---|
| JP | 2005-105212 | 4/2005 |
| JP | 2007-81881 | 3/2007 |
| JP | 2010-4397 | 1/2010 |
| JP | 2011-115687 | 6/2011 |
| JP | 2012-253480 | 12/2012 |
| JP | 2012-253481 | 12/2012 |
| WO | 01/03468 | 1/2001 |
| WO | 2009/011315 | 1/2009 |

OTHER PUBLICATIONS

International Search Report issued in International Application No. PCT/JP2020/026307, dated Sep. 15, 2020, along with an English translation thereof.

* cited by examiner

PROTECTIVE COVER MEMBER AND MEMBER SUPPLYING SHEET INCLUDING THE SAME

TECHNICAL FIELD

The present invention relates to a protective cover member configured to be placed on a face of an object to prevent a foreign matter from entering an opening of the face and a member supplying sheet for supplying the member.

BACKGROUND ART

Protective cover members configured to be placed on a face of an object to prevent a foreign matter from entering an opening of the face are known. Patent Literature 1 discloses a member including: a porous membrane including polytetrafluoroethylene (hereinafter referred to as "PTFE") as a main component, allowing sound to pass therethrough, and blocking a foreign matter such as a water drop from passing therethrough; and a heat-resistant double-sided adhesive sheet placed on a limited region of at least one principal surface of the porous membrane so as to fix the porous membrane to another component.

CITATION LIST

Patent Literature

Patent Literature 1: JP 2007-081881 A

SUMMARY OF INVENTION

Technical Problem

It is required to prevent a foreign matter from entering an opening of an object not only during use of the object as a product but also during production of the object and/or mounting of the object on another article. For this requirement, it is conceivable to place a protective cover member during production and/or mounting of an object as well as during use of an object as a product. However, unlike a protective cover member used on a product, it is appropriate in some cases to remove a protective cover member after production or mounting, for example, for the following reasons: (1) the protective cover member deteriorates in the process of production and mounting of an object; (2) performance required of the protective cover member is different from that required during use of an object as a product; and (3) the protective cover member is unnecessary during use of an object as a product. Removing a protective cover member could be accomplished mechanically by holding the protective cover member using a jig or by hand. However, conventional protective cover members are produced without taking removal thereof into account. Consequently, a piece broken off from a conventional protective cover member by holding sometimes enters an opening of an object to break the object, or a jig sometimes fails to appropriately hold a conventional protective cover member and damages a face of an object.

The present disclosure aims to provide a protective cover member capable of being removed with reduced damage to an object.

Solution to Problem

The present disclosure provides a protective cover member (a first protective cover member) configured to be placed on a face of an object to prevent a foreign matter from entering an opening of the face, the protective cover member including a laminate including:

a protective membrane having a shape configured to cover the opening when the protective cover member is placed on the face;

a substrate film joined to the protective membrane; and a first adhesive layer configured to fix the protective cover member to the face, wherein an outer peripheral surface of the protective cover member has a step in a laminating direction of the laminate, when the protective cover member is placed on the face, a first portion of the protective cover member protrudes at the step more outward than a second portion of the protective cover member does, the first portion being positioned farther from the face than the step, the second portion being positioned closer to the face than the step, and the protective membrane and the substrate film are positioned in the first portion.

In another aspect, the present disclosure provides a member supplying sheet including:

a substrate sheet; and at least one protective cover member placed on the substrate sheet, wherein the protective cover member is the above protective cover member.

Advantageous Effects of Invention

The first protective cover member includes the first portion including the protective membrane and the substrate film, the first portion protruding, at a position farther from a face of an object on which the member is placed, more outward than the second portion. This member is capable of being removed by holding the first portion protruding outward. Consequently, the member can be held more reliably, and breaking of the member is reduced at the time of holding the member. Moreover, damage to the protective membrane is reduced at the time of removal owing to the substrate film joined to the protective membrane. Therefore, the member can be removed with reduced damage to an object.

DESCRIPTION OF EMBODIMENTS

Embodiments will be described with reference to the drawings hereinafter. The present invention is not limited to the following embodiments.

[First Protective Cover Member]

Figure 1A:
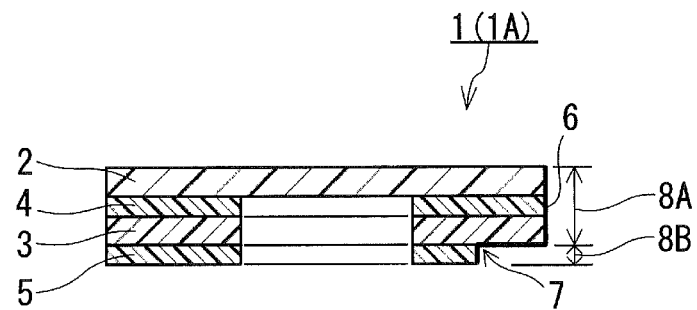
FIG. 1A is a cross-sectional view schematically showing an example of a first protective cover member.
Figure 1B:
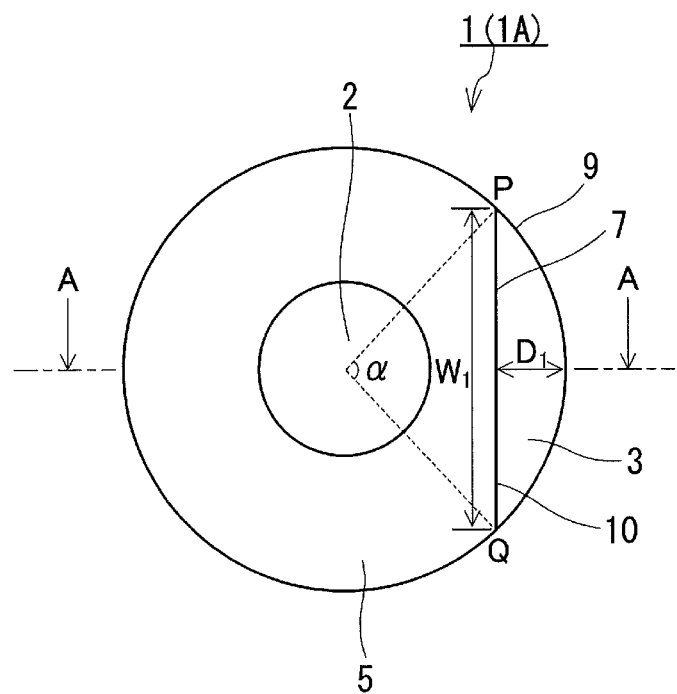
FIG. 1B is a plan view of the protective cover member of FIG. 1A viewed from a first adhesive layer 5 side.

FIGS. 1A and 1B show an example of a first protective cover member. FIG. 1B is a plan view of a protective cover member 1 (1A) of FIG. 1A viewed from a first adhesive layer 5 side (a placement face side to be closer to an object). FIG. 1A shows a cross-section A-A of FIG. 1B. The protective cover member 1A is a member configured to be placed on a face of an object to prevent a foreign matter from entering an opening of the face. The protective cover member 1A includes a laminate including a protective membrane 2, a substrate film 3, and a first adhesive layer 5. The protective membrane 2 has a shape configured to cover the opening when the protective cover member 1A is placed on the face. The substrate film 3 is joined to the protective membrane 2 by a second adhesive layer 4. The first adhesive layer 5 is provided on a face of the substrate film 3, the face being farther from the protective membrane 2. The substrate film 3 is positioned between the protective membrane 2 and the first adhesive layer 5. The protective membrane 2 is reinforced with the substrate film 3 for removing the protective cover member 1A from the face. The protective cover member 1A is fixed to the face by the first adhesive layer 5.

An outer peripheral surface 6 of the protective cover member 1A has a step 7 in a laminating direction of the laminate including the protective membrane 2, the substrate film 3, and the first adhesive layer 5. The protective cover member 1A has a first portion 8A positioned farther from the face than the step 7 and a second portion 8B positioned closer to the face than the step 7 when the protective cover member 1A is placed on the face. The first portion 8A protrudes at the step 7 more outward than the second portion 8B does. The protective membrane 2 and the substrate film 3 are positioned in the first portion 8A. The first adhesive layer 5 is positioned in the second portion 8B. The term "outward" as used herein refers to a direction away from a center of the protective cover member when viewed in the laminating direction (hereinafter referred to as "laminating direction") of the laminate. The term "inward" refers to a direction toward the center of the protective cover member when viewed in the laminating direction. To "view in the laminating direction" means to view along the laminating direction.

The outer peripheral surface 6 of the protective cover member 1A has the step 7 formed along a part of a perimeter of the outer peripheral surface 6. The step 7 connects two points (P, Q) on an outer perimeter 9 of the first portion 8A linearly when viewed in the laminating direction (FIG. 1B). The outer perimeter 9 is circular when viewed in the laminating direction, and the step 7 connects the points (P, Q) on the circle as a chord. A central angle α made by two line segments extending inward from the points (P, Q) to the center is about 90°. However, the shape of the step 7 and the number of steps 7 are not limited to this example. The step 7 may connect the points (P, Q) non-linearly, for example, in a curved line or in a zig-zag manner when viewed in the laminating direction. The central angle α is not limited to 90°. FIGS. 2A and 2B and FIGS. 3A and 3B show modifications of the protective cover member 1 in which the shape of the step 7 or the number of steps 7 is different.

Figure 2A:
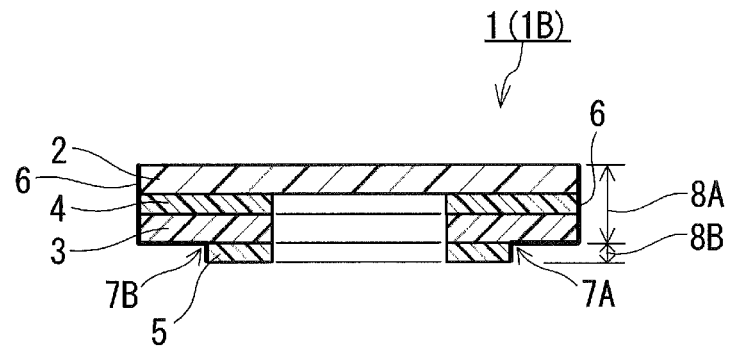
FIG. 2A is a cross-sectional view schematically showing another example of the first protective cover member.
Figure 2B:
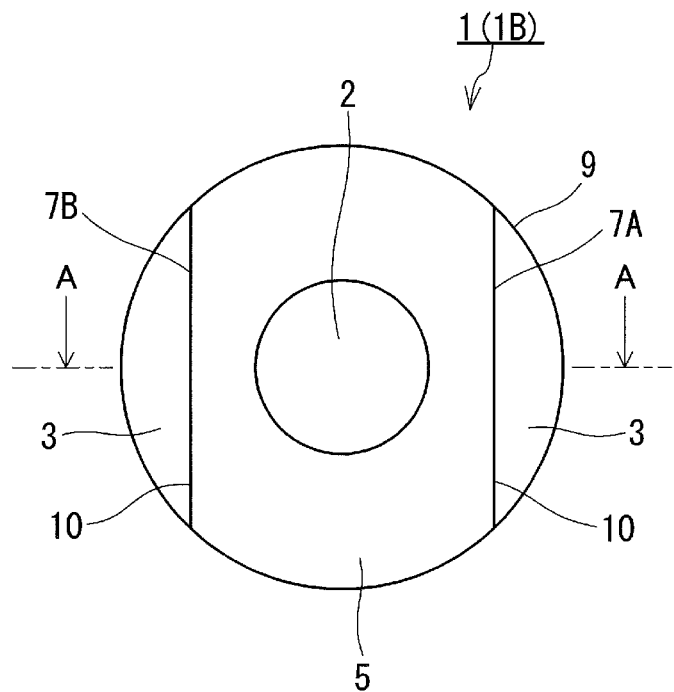
FIG. 2B is a plan view of the protective cover member of FIG. 2A viewed from the first adhesive layer 5 side.

A protective cover member 1B of FIGS. 2A and 2B has the same configuration as that of the protective cover member 1A, except that the number of steps 7 is different. The outer peripheral surface 6 of the protective cover member 1B has two steps 7A and 7B. Each of the steps 7A and 7B is formed along a part of the perimeter of the outer peripheral surface 6. The steps 7A and 7B face each other with a center of the protective cover member 1B in between when viewed in the laminating direction. The protective cover member 1B can be removed by holding the first portion 8A protruding outward at the step 7A and/or the first portion 8A protruding outward at the step 7B. FIG. 2B is a plan view of the protective cover member 1B of FIG. 2A viewed in the laminating direction from the first adhesive layer 5 side. FIG. 2A shows a cross-section A-A of FIG. 2B.

Figure 3A:
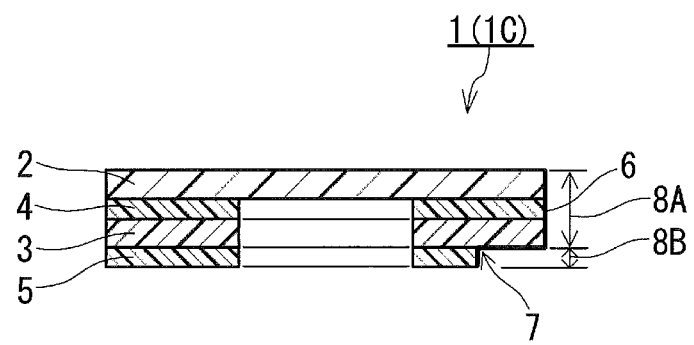
FIG. 3A is a cross-sectional view schematically showing a yet another example of the first protective cover member.
Figure 3B:
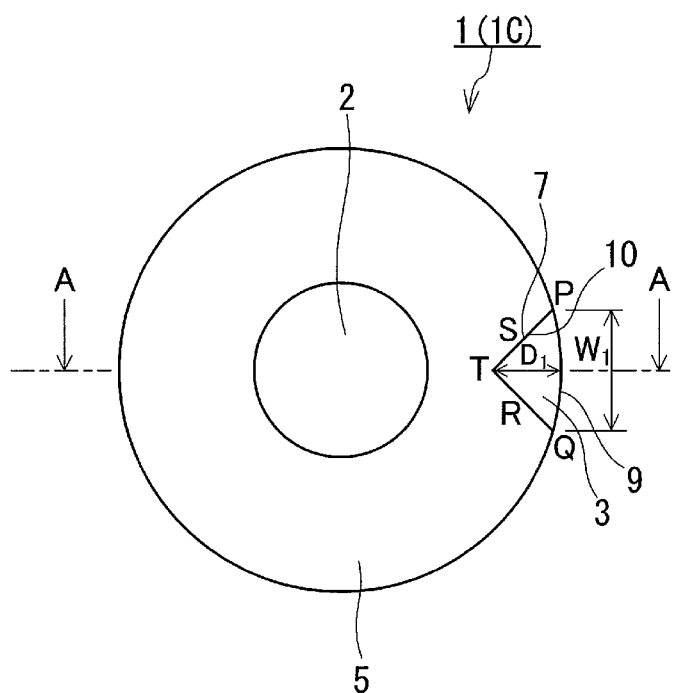
FIG. 3B is a plan view of the protective cover member of FIG. 3A viewed from the first adhesive layer 5 side.

A protective cover member 1C shown in FIGS. 3A and 3B has the same configuration as that of the protective cover member 1A, except that the shape of the step 7 is different. The step 7 of the protective cover member 1C has a shape formed by two line segments (R, S) respectively extending inward from the two points (Q, P) on the outer perimeter 9 of the first portion 8A to intersect with each other when viewed in the laminating direction. Each of the line segments (R, S) corresponds to a portion of a side extending from one vertex T of a polygon. The polygon is a square or a rectangle, and an angle PTQ at which the line segments (R, S) intersect is about 90°. However, the shape of the polygon is not limited to a square and a rectangle, and the angle PTQ may not be 90°. FIG. 3B is a plan view of the protective cover member 1C of FIG. 3A viewed in the laminating direction from the first adhesive layer 5 side. FIG. 3A shows a cross-section A-A of FIG. 3B.

The protective cover members 1A, 1B, and 1C each have the shape of a circle when viewed in the laminating direction. However, the shape of the protective cover member 1 is not limited to the above examples and may be, for example, a polygon such as a square or a rectangle or an ellipse when viewed in the laminating direction. The polygon may be a regular polygon such as a regular triangle, a regular pentagon, a regular hexagon, a regular heptagon, or a regular octagon. The corners of the polygon may be rounded.

Figure 4A:
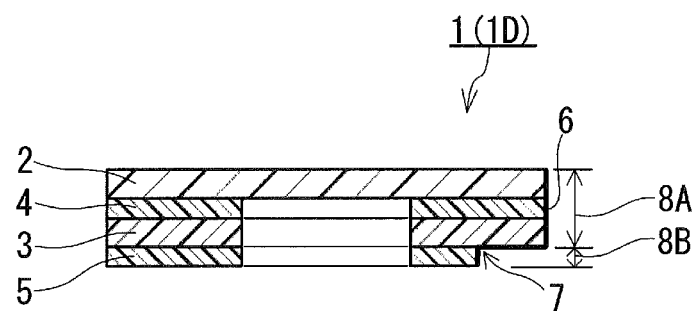
FIG. 4A is a cross-sectional view schematically showing yet another example of the first protective cover member.
Figure 4B:
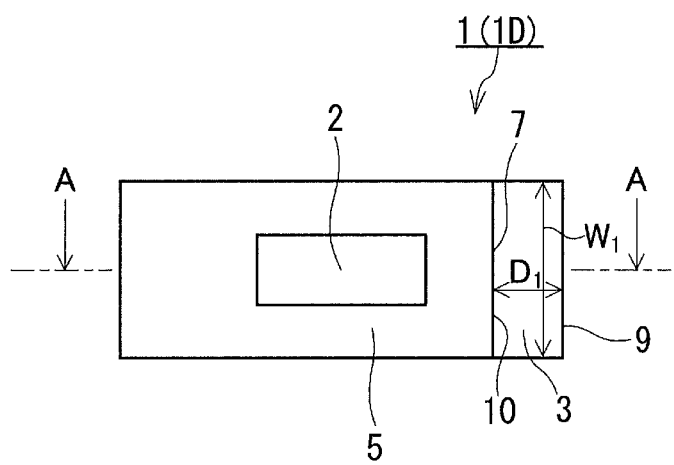
FIG. 4B is a plan view of the protective cover member of FIG. 4A viewed from the first adhesive layer 5 side.

FIGS. 4A and 4B show an example of the protective cover member 1 having a rectangular shape. A protective cover member 1D of FIGS. 4A and 4B has the same configuration as that of the protective cover member 1A, except that the shape thereof is a rectangle when viewed in the laminating direction. The step 7 of the protective cover member 1D extends linearly and parallel to a short side of the outer perimeter 9 of the first portion 8A having a rectangular shape when viewed in the laminating direction. The shape of the step 7 is not limited to this example. For example, the step 7 may extend linearly and not in parallel to a short side of the outer perimeter 9 or may extend non-linearly (e.g., in a curved line) when viewed in the laminating direction.

The first portion 8A of each of the protective cover members 1A, 1B, and 1C has the shape of a circle when viewed in the laminating direction, and an outer perimeter 10 of the second portion 8B is recessed inward with respect to the outer perimeter 9 of the first portion 8A to form the step 7. The outer perimeter 10 of the second portion 8B may be recessed inward with respect to the outer perimeter 9 of the first portion 8A to form the step 7 also in the case where the first portion 8A has the shape of an ellipse or a regular polygon when viewed in the laminating direction. In these embodiments, a width (a width viewed in the laminating direction) of the second portion 8B is narrow in an inward recessed portion, and thus removal by holding the first portion 8 can be accomplished more reliably and steadily.

Figure 5A:
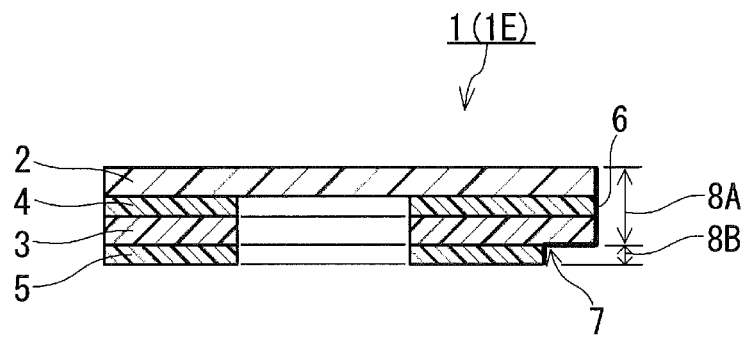
FIG. 5A is a cross-sectional view schematically showing an example of the first protective cover member other than the above examples.
Figure 5B:
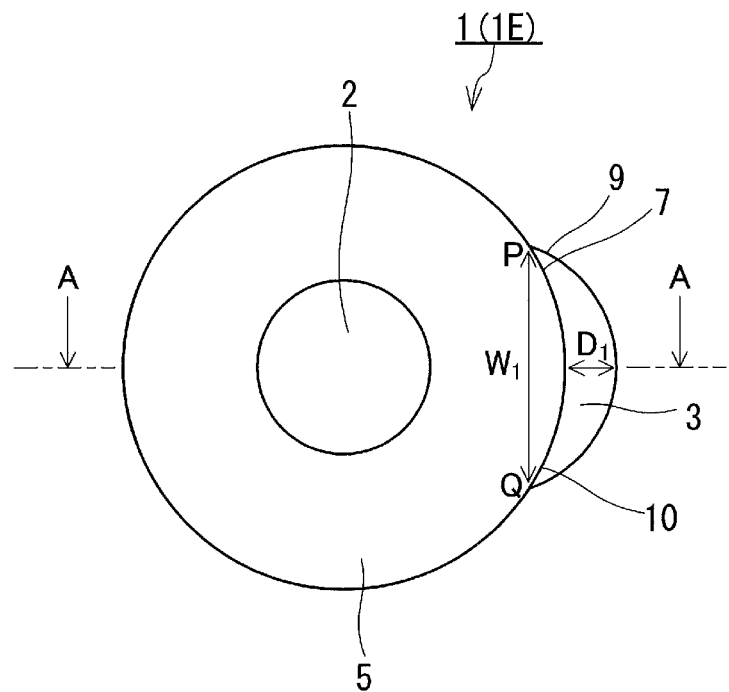
FIG. 5B is a plan view of the protective cover member of FIG. 5A viewed from the first adhesive layer 5 side.

FIGS. 5A and 5B show an example of the protective cover member 1 other than the above examples. A protective cover member 1E of FIGS. 5A and 5B has the same configuration as that of the protective cover member 1A, except that the shape of the step 7 is different. The outer perimeter 10 of the second portion 8B of the protective cover member 1E is circular when viewed in the laminating direction, and the step 7 connects two points (P, Q) on the circle as a chord. The outer perimeter 9 of the first portion 8A protrudes more outward than the outer perimeter 10 of the second portion 8B does to form the step 7. The outer perimeter 9 of the first portion 8A may protrude more outward than the outer perimeter 10 of the second portion 8B does to form the step 7 also in the case where the second portion 8B has the shape of an ellipse or a regular polygon when viewed in the laminating direction.

The outer peripheral surface 6 may have the step 7 formed along the entire perimeter.

A depth $D_1$ of an outward protruding region of the first portion 8A is, for example, 0.1 to 20 mm, and may be 0.5 to 20 mm, 1 to 15 mm, or even 1 to 10 mm. The depth $D_1$ corresponds to the longest distance between the outer perimeter 9 of the first portion 8A and the outer perimeter 10 of the second portion 8B in the above region when viewed in the laminating direction. For the step 7 formed along a part of the perimeter of the outer peripheral surface 6, a largest width (a width viewed in the laminating direction) $W_1$ of the above region is, for example, 0.1 to 20 mm and may be 0.5 to 20 mm, 1 to 15 mm, or even 1 to 10 mm. However, the depth $D_1$ and the width $W_1$ may be much larger depending on the type of an object on which the protective cover member 1 is placed. When the depth $D_1$ and/or the width $W_1$, particularly the depth $D_1$, is in the above range, the protective cover member 1 can be more reliably removed from an object with reduced damage to the protective cover member 1. Moreover, in the case of the protective cover member 1 caused to be curled as described later by treatment under high temperatures, the larger the depth $D_1$ and/or the width $W_1$, particularly the depth $D_1$, of the above region is, the more likely the degree of curling (curling rate) is to increase.

A ratio $W_1/D_1$ of the width $W_1$ of the outward protruding region of the first portion 8A to the depth $D_1$ thereof is, for example, 0.1 to 10 and may be 0.5 to 8.0 or even 1.0 to 5.0. When the ratio $W_1/D_1$ is in the above range, the protective cover member 1 can be more reliably removed from an object with reduced damage to the protective cover member 1.

The area (the area viewed in the laminating direction; the same applies hereinafter) of the outward protruding region of the first portion 8A is, for example, 3 to 50% and may be 5 to 40% when the area of the first portion 8A is defined as 100%. In the case where the first portion 8A has two or more outward protruding regions, the total area of the regions may be within the above range. With the area of the region(s) within the above range, the protective cover member 1 can be more reliably removed from an object with reduced damage to the protective cover member 1.

The protective membrane 2 may be air-impermeable in a thickness direction or may have air permeability in a thickness direction. With the protective membrane 2 having air permeability in the thickness direction, the protective cover member 1 placed on an object can secure air permeability between the protective cover member 1 and an opening of the object while preventing a foreign matter from entering the opening. By securing the air permeability, for example, adjustment of pressure and reduction of pressure variability can be achieved by means of the opening of the object. An example of reducing pressure variability is shown hereinafter. In some cases, heat treatment such as reflow soldering is performed with a semiconductor device placed to cover one opening of a through hole provided in a circuit board. With the protective cover member 1 placed to cover the other opening of the through hole, entrance of a foreign matter into the device through the through hole can be reduced during heat treatment. In the case where the protective membrane 2 has air permeability in the thickness direction, a heat-induced increase in pressure in the through hole is reduced and damage to the device by the pressure increase can be prevented. Examples of the semiconductor device include micro electro mechanical system (hereinafter referred to as "MEMS") devices such as microphones, pressure sensors, and acceleration sensors. These devices have an opening allowing air or sound to pass therethrough, and can be placed on a circuit board so that the opening will face a through hole provided in the circuit board.

The protective membrane 2 having air permeability in the thickness direction has an air permeability of, for example, 100 sec/100 mL or less as expressed in terms of an air permeability (hereinafter referred to as "Gurley air permeability") obtained according to Method B (Gurley method) of air permeability measurement specified in Japanese Industrial Standards (hereinafter referred to as "JIS") L 1096.

Examples of the material forming the protective membrane 2 include a metal, a resin, and a composite material thereof.

Examples of the resin that can form the protective membrane 2 include polyolefins such as polyethylene and polypropylene, polyesters such as polyethylene terephthalate (PET), silicone resins, polycarbonates, polyimides, polyamideimides, polyphenylene sulfide, polyetheretherketone (PEEK), and fluorine resins. Examples of the fluorine resins include PTFE, tetrafluoroethylene-perfluoroalkyl vinyl ether copolymer (PFA), tetrafluoroethylene-hexafluoropropylene copolymer (FEP), and tetrafluoroethylene-ethylene copolymer (ETFE). However, the resin is not limited to the above examples.

Examples of the metal that can form the protective membrane 2 include stainless steel and aluminum.

The protective membrane 2 may be formed of a heat-resistant material. In this case, resistance to treatment, such as reflow soldering, under high temperatures can be ensured depending on the materials of the other layers of the protective cover member 1. Examples of the heat-resistant material include a metal and a heat-resistant resin. Typical heat-resistant resins have a melting point of 150° C. or higher. The heat-resistant resin may have a melting point of 160° C. or higher, 200° C. or higher, 250° C. or higher, 260° C. or higher, or even 300° C. or higher. Examples of the heat-resistant resin include a silicone resin, a polyimide, a polyamideimide, polyphenylene sulfide, PEEK, and a fluorine resin. The fluorine resin may be PTFE. PTFE is excellent particularly in heat resistance.

The protective membrane 2 having air permeability in the thickness direction may include a stretched porous membrane. The stretched porous membrane may be a stretched porous fluorine resin membrane, particularly a stretched porous PTFE membrane. The stretched porous PTFE membrane is commonly formed by stretching a cast membrane or a paste extrusion containing PTFE particles. The stretched porous PTFE membrane is formed of fine PTFE fibrils and can have a node in which PTFE is more highly aggregated than in the fibrils. With the stretched porous PTFE membrane, it is possible to achieve both the performance of preventing a foreign matter from entering and air permeability at high levels. A known stretched porous membrane can be used as the protective membrane 2.

The protective membrane 2 having air permeability in the thickness direction may include a perforated membrane in which a plurality of through holes connecting both principal surfaces of the membrane are formed. The perforated membrane may be a membrane formed by providing a plurality of through holes to an original membrane such as an imperforate membrane, the original membrane having a non-porous matrix structure. The perforated membrane may have no other ventilation paths in the thickness direction than the plurality of through holes. The through hole may extend in the thickness direction of the perforated membrane or may be a straight hole linearly extending in the thickness direction. An opening of the through hole may have the shape of a circle or an ellipse when viewed perpendicularly to a principal surface of the perforated membrane. The perforated membrane can be formed, for example, by laser processing of the original membrane or by ion beam irradiation of the original membrane and subsequent perforation of the resulting membrane by chemical etching.

The protective membrane 2 having air permeability in the thickness direction may include a non-woven fabric, a woven fabric, a mesh, or a net.

The protective membrane 2 is not limited to the above examples.

The protective membrane 2 of each of the protective cover members 1A to 1C and 1E has the shape of a circle when viewed in the laminating direction. The protective membrane 2 of the protective cover member 1D has the shape of a rectangle when viewed in the laminating direction. However, the shape of the protective membrane 2 is not limited to these examples, and may be, for example, a polygon such as a square or a rectangle or an ellipse when viewed in the laminating direction. The polygon may be a regular polygon. The corners of the polygon may be rounded.

The protective membrane 2 has a thickness of, for example, 1 to 100 µm.

The protective membrane 2 has an area of, for example, 175 $mm^2$ or less. The protective cover member 1 including the protective membrane 2 having an area within this range is, for example, suitable for being placed on a MEMS device or circuit board that commonly has a small-diameter opening. The lower limit of the area of the protective membrane 2 is, for example, 0.20 $mm^2$ or more. However, the area of the protective membrane 2 may be larger depending on the type of an object on which the protective cover member 1 is placed.

Examples of the material forming the substrate film 3 include a metal, a resin, and a composite material thereof. Specific examples of the material that can form the substrate film 3 are the same as the specific examples of the material that can form the protective membrane 2. The material forming the protective membrane 2 and the material forming the substrate film 3 may be different from each other.

The substrate film 3 may be formed of a heat-resistant material. In this case, a resistance to treatment, such as reflow soldering, under high temperatures can be ensured depending on the materials of the other layers of the protective cover member 1. Specific examples of the heat-resistant material are those described above in the description of the protective membrane 2.

The substrate film 3 of each of the protective cover members 1A to 1E has an outer perimeter coinciding with an outer perimeter of the protective membrane 2 when viewed in the laminating direction. The substrate film 3 of each of the protective cover members 1A to 1E has a shape corresponding to a peripheral portion of the protective membrane 2 when viewed in the laminating direction. The substrate film 3 of each of the protective cover members 1A to 1C and 1E is in the shape of a ring, and the substrate film 3 of the protective cover member 1D is in the shape of a frame. A face of the protective membrane 2 on the substrate film 3 side is exposed in a region not in contact with the substrate film 3. When the protective membrane 2 has air permeability in the thickness direction, the region can be an air-permeable region of the protective cover member 1. However, the shape of the substrate film 3 is not limited to the above examples.

The air-permeable region has an area of, for example, 20 $mm^2$ or less. The protective cover member including the air-permeable region having an area within this range is, for example, suitable for being placed on a MEMS device or circuit board that commonly has a small-diameter opening. The lower limit of the area of the air-permeable region is, for example, 0.008 $mm^2$ or more. However, the area of the air-permeable region may be larger depending on the type of an object on which the protective cover member 1 is placed.

The substrate film 3 has a thickness of, for example, 5 to 200 µm.

The substrate film 3 of each of the protective cover members 1A to 1E is positioned between the protective membrane 2 and the first adhesive layer 5. However, the position of the substrate film 3 is not limited to this example. The substrate film 3 may be placed on a top face of the protective membrane 2. The term "top face" refers to a face positioned farther from an object when the protective cover member is placed on a face of the object. The term "bottom face" refers to a face positioned closer to an object when the protective cover member is placed on a face of the object.

The substrate film 3 may have higher strength than that of the protective membrane 2. In this case, breaking of the protective membrane 2 can be more reliably reduced at the time of removing the protective cover member 1. The strength can be evaluated, for example, as tensile breaking strength or cohesive failure strength.

The protective membrane 2 and the substrate film 3 of each of the protective cover members 1A to 1E are joined by the second adhesive layer 4. The second adhesive layer 4 is, for example, a layer to which an adhesive (a pressure-sensitive adhesive can be used) are applied. Examples of the adhesive include an acrylic-based adhesive, a silicone-based adhesive, a urethane-based adhesive, an epoxy-based adhesive, and a rubber-based adhesive. It is preferred that an acrylic- or silicone-based adhesive, which is highly heat resistant, particularly a silicone-based adhesive, be selected when use of the protective cover member 1 under high temperatures needs to be taken into account.

Examples of the acrylic-based adhesive include adhesives disclosed in JP 2005-105212 A. Examples of the silicone-based adhesive include adhesives (including those disclosed as Comparative Examples) disclosed in JP 2003-313516 A.

The second adhesive layer 4 may be a single layer, or may have a laminate structure including two or more adhesive layers.

The second adhesive layer 4 may be a double-sided adhesive tape. The double-sided adhesive tape may be a substrate-including tape including a substrate and an adhesive layer provided on both surfaces of the substrate or may be a substrate-less tape including no substrate. The second adhesive layer 4 may have a laminate structure including: a single-sided adhesive tape including a substrate and an adhesive layer provided on one surface of the substrate; and an additional adhesive layer formed by applying an adhesive to a surface of the substrate, the surface being farther from the adhesive layer of the tape.

The substrate and the adhesive layer of the adhesive tape may be used as the substrate film 3 and the second adhesive layer 4, respectively. The substrate film 3 may not be a layer included in the adhesive tape.

The substrate of the adhesive tape is, for example, a film, a non-woven fabric, or a foam made of a resin, a metal, or a composite material thereof. The substrate of the adhesive tape may be formed of a heat-resistant material. In this case, a resistance to treatment, such as reflow soldering, under high temperatures can be ensured depending on the materials of the other layers of the protective cover member 1. Specific examples of the heat-resistant material are those described above in the description of the protective membrane 2.

The second adhesive layer 4 of each of the protective cover members 1A to 1E has the same shape as that of the substrate film 3 when viewed in the laminating direction. However, the shape of the second adhesive layer 4 is not limited to this example. For example, the protective membrane 2 and the substrate film 3 may be joined by the second adhesive layer 4 that is in the shape of a dot, a lattice, or a wave when viewed in the laminating direction.

The method for joining the protective membrane 2 and the substrate film 3 is not limited to the above example. The protective membrane 2 and the substrate film 3 may be joined by any of various welding techniques such as heat welding or ultrasonic welding without the second adhesive layer 4 interposed therebetween.

Depending on the combination of the protective membrane 2 and the substrate film 3, the outward protruding region of the first portion 8A can be deflected (curled) in a direction away from a face of an object (the direction is hereinafter referred to as "upward"), for example, by treatment under high temperatures. In other words, the first portion 8A may have a configuration in which the region protruding outward at the step 7 can be curled upward by heating. The protective cover member 1 can be more reliably removed owing to the upward curling.

The upward curing can be caused, for example, by selecting the protective membrane 2 and/or the substrate film 3 as follows. However, the curing method is not limited to these examples.

(1) The protective membrane 2 having a relatively small thermal expansion coefficient and the substrate film 3 having a relatively large thermal expansion coefficient are selected. A difference between the thermal expansion coefficients of the joined two layers causes curling.

(2) A membrane having a pore and/or a through hole is selected as the protective membrane 2. Specific examples of the membrane include a membrane having air permeability in the thickness direction. The membrane having a pore and/or a through hole tends to shrink by heat. The shrinkage causes curling.

Curling is likely to be caused when the first portion 8A viewed in the laminating direction is circular, elliptical, or regular polygonal and the outer perimeter 10 of the second portion 8B is recessed inward with respect to the outer perimeter 9 of the first portion to form the step 7. Moreover, curling is likely to be caused when the step 7 extends linearly when viewed in the laminating direction.

The degree of curling of the outward protruding region of the first portion 8A of the protective cover member 1 may be 110% or more as represented by a curling rate and may be 130% or more, 200% or more, 250% or more, 300% or more, 350% or more, 400% or more, or even 450% or more when the member 1 is fixed to a surface of a stainless steel plate and subjected to heat treatment from 25° C. to 260° C. at a temperature increase rate of 1° C./sec. The curling rate can be determined by the following equation from maximum heights ($H_0$ before the heat treatment and $H_1$ after the heat treatment) of the above region using the surface of the stainless steel plate as a reference surface: curling rate (%)=$H_1/H_0 \times 100$. The protective cover member 1 is fixed to the stainless steel plate using the first adhesive layer 5.

A top face and/or a bottom face of the outward protruding region of the first portion 8A preferably has non-adhesiveness. In this case, adhesion between the region and a jig or a hand used to remove the protective cover member 1 can be prevented and the protective cover member 1 can be removed more reliably and steadily.

The first adhesive layer 5 can have the same configuration as that of the second adhesive layer 4, except for the shape. For example, the first adhesive layer 5 may be formed of a double-sided adhesive tape, or may have a laminate structure including a single-sided adhesive tape and an additional adhesive layer formed by applying an adhesive to a surface of a substrate of the tape, the surface being farther from an adhesive layer of the tape. In this case, the additional adhesive layer may be positioned on the protective membrane 2 side or may be positioned on the placement face side to be closer to an object. The first adhesive layer 5 may have a low-adhesive face on the object side. In this case, the protective cover member 1 can be removed with a smaller force.

The first adhesive layer 5 of each of the protective cover members 1A to 1E is positioned in the second portion 8B. However, the position of the first adhesive layer 5 is not limited to this example. The first adhesive layer 5 may be positioned closer to an object than the second portion 8B when the protective cover member 1 is placed on a face of the object.

The first adhesive layer 5 of each of the protective cover members 1A to 1E has a shape configured to surround an opening of an object when the protective cover member 1 is placed on a face of the object and viewed in the laminating direction. However, the shape of the first adhesive layer 5 is not limited to this example as long as the protective cover member 1 can be fixed to an object.

The first adhesive layer 5 has a thickness of, for example, 10 to 200 μm.

The protective cover member 1 has an area of, for example, 175 mm² or less. The protective cover member 1 having an area within this range is, for example, suitable for being placed on a MEMS device or circuit board that commonly has a small-diameter opening. The lower limit of the area of the protective cover member 1 is, for example, 0.20 mm² or more. However, the area of the protective cover member 1 may be larger depending on the type of an object on which the protective cover member 1 is placed. The smaller the area of the protective cover member 1 is, the more difficult it is to remove the protective cover member 1. Therefore, the effects of the present invention are particularly significant when the protective cover member 1 has an area within the above range.

The protective cover member 1 may include an optional layer other than those described above as long as the effects of the present invention can be obtained.

An object on which the protective cover member 1 can be placed is, for example, a circuit board as described above. The object may be a semiconductor device such as a MEMS device. The MEMS device may be a non-encapsulated device having a ventilation hole on a surface of its package. The diameter of the ventilation hole of the MEMS device is commonly small. Examples of the non-encapsulated MEMS device include various sensors detecting the atmospheric pressure, humidity, gas, air flow, and the like and electroacoustic transducer elements such as speakers and microphones. However, the object is not limited to the above examples.

A face of an object on which the protective cover member 1 can be placed is typically a surface of the object. The face may be a flat face or a curved face. An opening of the object may be an opening of a recessed portion or an opening of a through hole.

A treatment of an object on which the protective cover member 1 is placed may be a treatment under high temperatures or low temperatures.

The protective cover member 1 can be produced, for example, by shape processing and lamination of the protective membrane 2, the substrate film 3, and the first adhesive layer 5.

The protective cover member 1 can be supplied in a state of being placed on a release sheet such as a release paper or a release liner. A plurality of the protective cover members 1 may be placed on the release sheet. The adhesive layer (e.g., the first adhesive layer 5) included in the protective cover member 1 may be used to place the protective cover member 1 on the release sheet. Alternately, a low-adhesive layer may be provided on a face of the release sheet, so that the protective cover member 1 is placed on the release sheet with the low-adhesive layer interposed therebetween. A member supplying sheet including a release sheet being a substrate sheet will be described later.

Figure 6:
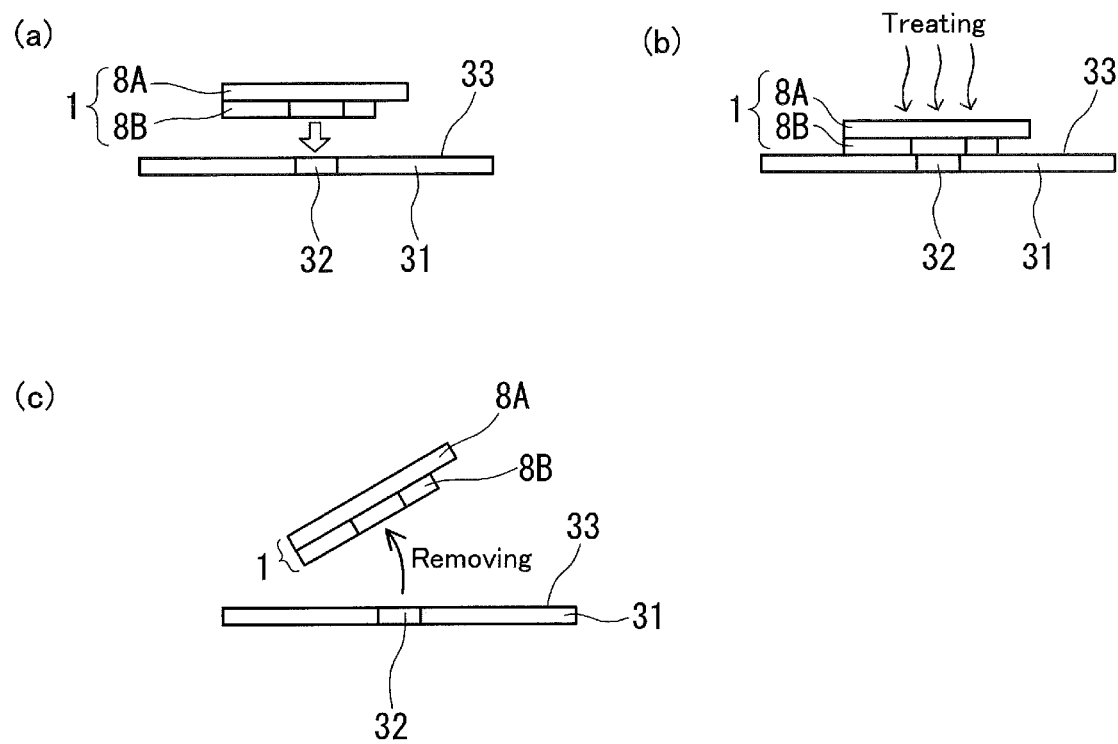
FIG. 6 is a process chart schematically showing an example of an embodiment of using the first protective cover member.

FIG. 6 shows an example of an embodiment of using the protective cover member 1.

As shown in FIG. 6 (a), the protective cover member 1 is placed on a surface 33 of an object 31 having an opening 32 such that the protective membrane 2 covers the opening 32. The protective cover member 1 is commonly placed such that the first adhesive layer 5 does not overlap the opening 32 when viewed in the laminating direction. Next, the object 31 on which the protective cover member 1 is placed is subjected to a given treatment (FIG. 6 (b)). After the treatment, the protective cover member 1 is removed from the surface 33 (FIG. 6 (c)).

The embodiment of using the protective cover member 1 is not limited to the above example. For example, after the treatment, the protective cover member 1 may not be necessarily removed and may remain on the surface 33. The object 31 can be distributed or used with the protective cover member 1 remaining on the surface 33. The protective cover member 1 can be removed at any timing after distribution and/or use of the object.

[Second Protective Cover Member]

In another aspect than the above, the present disclosure provides a protective cover member (second protective cover member) configured to be placed on a face of an object to prevent a foreign matter from entering an opening of the face, the protective cover member including a laminate including:

a protective membrane having a shape configured to cover the opening when the protective cover member is placed on the face;

an adhesive layer (a third adhesive layer) configured to fix the protective cover member to the face, wherein a portion of a placement face to be on the face, is a low-adhesive face and/or a non-adhesive face, the placement face being included in the protective cover member.

In the second protective cover member, a portion of the placement face to be closer to an object is a low-adhesive face and/or a non-adhesive face. Therefore, the member can be removed by smoother peeling from an object owing to the low-adhesive face and/or the non-adhesive face while breaking of the member is reduced. Thus, the member can be removed with reduced damage to an object.

An embodiment of the second protective cover member will be described hereinafter. Layers and members common to the second protective cover member and the first protective cover member 1 are denoted by the same reference characters and are not described repeatedly.

Figure 7A:
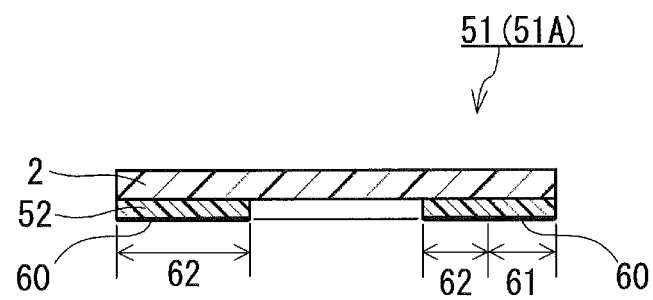
FIG. 7A is a cross-sectional view schematically showing an example of a second protective cover member.
Figure 7B:
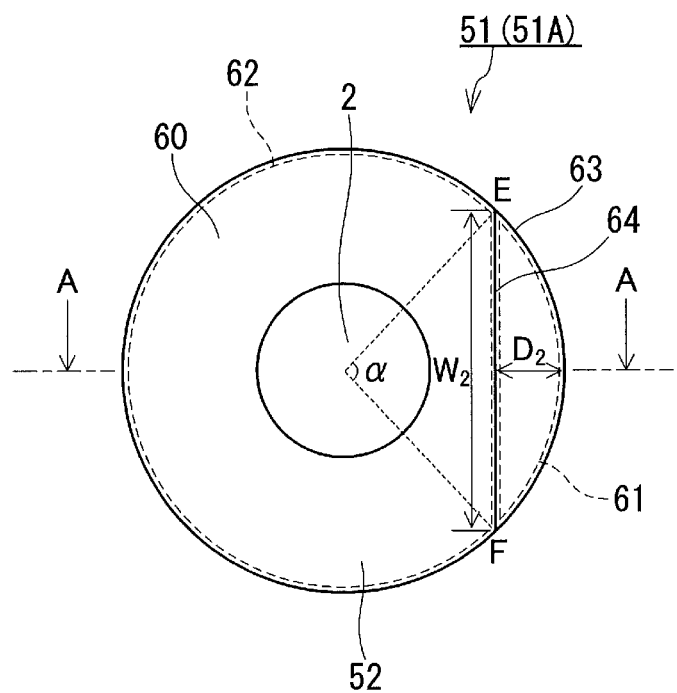
FIG. 7B is a plan view of the protective cover member of FIG. 7A viewed from a third adhesive layer 52 side.

FIGS. 7A and 7B show an example of the second protective cover member. FIG. 7B is a plan view of a protective cover member 51 (51A) of FIG. 7A viewed from a third adhesive layer 52 side (a placement face 60 side to be closer to an object). FIG. 7A shows a cross-section A-A of FIG. 7B. The protective cover member 51A is a member configured to be placed on a face of an object to prevent a foreign matter from entering an opening of the face. The protective cover member 51A includes a laminate including the protective membrane 2 and the third adhesive layer 52. The protective membrane 2 has a shape configured to cover the opening when the protective cover member 51A is placed on the face. The protective membrane 2 and the third adhesive layer 52 are joined to each other. The protective cover member 51A is fixed to the face by the third adhesive layer 52.

A portion (a portion 61) of the placement face 60 of the protective cover member 51A is a low-adhesive face and/or a non-adhesive face and is preferably a non-adhesive face. The term "low-adhesive face" refers to a face having lower adhesiveness than that of another portion 62 of the placement face 60.

The portion 61 of the protective cover member 51A may be a treated face where the adhesiveness of the third adhesive layer 52 is decreased. The treated face may be a deactivated face from which the adhesiveness is lost. The treated face of the adhesive layer is formed, for example, by the following methods. However, the method for forming the treated face is not limited to the following examples.

[I] A portion to be turned into the treated face of the adhesive layer is subjected to plasma treatment. The plasma treatment deteriorates an adhesive in the portion to form a treated face.

[II] An adhesive polymer included in a portion to be turned into the treated face of the adhesive layer is subjected to further polymerization such as graft polymerization or copolymerization to modify the portion.

[III] A ultraviolet absorber and/or a thermal foaming agent is included in the adhesive layer, and ultraviolet light and/or heat is applied to a portion to be turned into the treated face to modify the portion.

[IV] An adhesiveness reducing agent is brought into contact with a portion to be turned into the treated face of the adhesive layer. When the adhesive layer is formed of an acrylic-based adhesive, the adhesiveness reducing agent is, for example, a solution containing a silicone compound. The adhesiveness reducing agent can be brought into contact with the portion, for example, by applying or spraying the adhesiveness agent.

The portion 61 of the protective cover member 51A is surrounded by a part E-F of an outer perimeter 63 of the placement face 60 and a line 64 connecting both ends (E, F) of the part E-F when viewed in the laminating direction of the laminate. The line 64 forms a boundary between the portion 61 and the portion 62. The outer perimeter 63 is circular when viewed in the laminating direction, and the line 64 which is a straight line connects the ends (E, F) as a chord. The central angle α made by two line segments extending inward to the center from the ends (E, F) is about 90°. The protective cover member 51A and the placement face 60 thereof have one portion 61. However, the shape of the portion 61, the number of portions 61, the placement of the portion 61, the positions of the ends (E, F) on the outer perimeter 63, an embodiment of the line 64, and the like are not limited to the above examples. The protective cover member 51A and the placement face 60 may have two or more portions 61. The line 64 may be non-linear, e.g., curved, or may connect the ends (E, F) in a zig-zag manner. The central angle α is not limited to 90°.

A maximum width (a width viewed in the laminating direction) $W_2$ of the portion 61 is, for example, 0.1 to 20 mm, and may be 0.5 to 20 mm, 1 to 15 mm, or even 1 to 10 mm. A depth $D_2$ of the portion 61 is, for example, 0.1 to 20 mm, and may be 0.5 to 20 mm, 1 to 15 mm, or even 1 to 10 mm. The depth $D_2$ corresponds to the longest distance between the outer perimeter 63 and the line 64 when viewed in the laminating direction. However, the width $W_2$ and the depth $D_2$ may be larger depending on the type of an object on which the protective cover member 51A is placed. When the depth $D_2$ and/or the width $W_2$, particularly the depth $D_2$, is within the above range, the protective cover member 51 can be more reliably removed from an object with reduced damage to the protective cover member 51. Moreover, in the case of the protective cover member 51 caused to be curled as described later by treatment under high temperatures, the larger the depth $D_2$ and/or the width $W_2$, particularly the depth $D_2$, of the portion 61 is, the more likely the degree of curling (curling rate) is to increase.

A ratio $W_2/D_2$ of the width $W_2$ of the portion 61 to the depth $D_2$ thereof is, for example, 0.1 to 10, and may be 0.5 to 8.0 or even 1.0 to 5.0. When the ratio $W_2/D_2$ is within the above range, the protective cover member 51 can be more reliably removed from an object with reduced damage to the protective cover member 51.

The portion 61 has an area (the area viewed in the laminating direction; the same applies hereinafter) of, for example, 3 to 50% and may be 5 to 40% when the area of the placement face 60 is defined as 100%. When the placement face 60 has two or more portions 61, the total area of the portions 61 may be within the above range. When the area of the portion 61 is within the above range, the protective cover member 51 can be more reliably removed from an object with reduced damage to the protective cover member 51.

The third adhesive layer 52 can have the same configuration as that of the first adhesive layer 5 and/or the second adhesive layer 4 of the first protective cover member 1 as long as the third adhesive layer 52 includes the portion 61. The placement face of the first adhesive layer 5 of the first protective cover member 1 may have the portion 61.

A face of the protective membrane 2 on the third adhesive layer 52 side is exposed in a region not in contact with the third adhesive layer 52. When the protective membrane 2 has air permeability in the thickness direction, the region can be an air-permeable region of the protective cover member 51A. The area of the air-permeable region is, for example, 20 mm² or less. The protective cover member including the air-permeable region having an area within the range is, for example, suitable for being placed on a MEMS device or circuit board that commonly has a small-diameter opening. The lower limit of the area of the air-permeable region is, for example, 0.008 mm² or more. However, the area of the air-permeable region may be within a larger range depending on the type of an object on which the protective cover member 51A is placed.

The embodiment of the portion 61 is not limited to the above example as long as the portion 61 is a low-adhesive face and/or a non-adhesive face. FIGS. 8A to 11 show other examples including different embodiments of the portion 61.

Figure 8A:
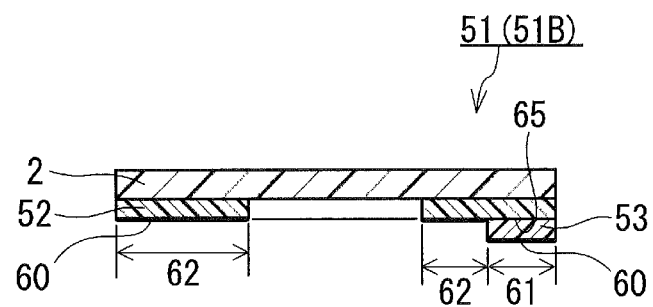
FIG. 8A is a cross-sectional view schematically showing another example of the second protective cover member.
Figure 8B:
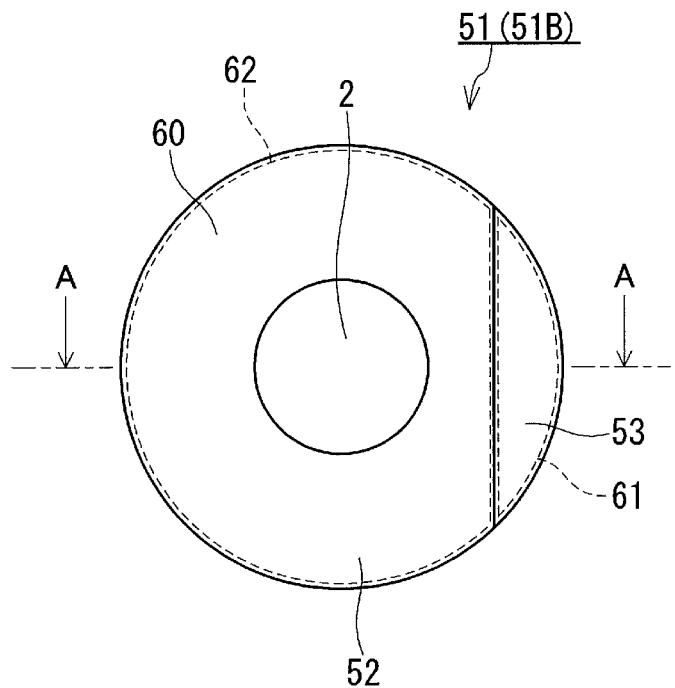
FIG. 8B is a plan view of the protective cover member of FIG. 8A viewed from the third adhesive layer 52 side.

A protective cover member 51 (51B) shown in FIGS. 8A and 8B has the same configuration as that of the protective cover member 51A, except that the portion 61 is formed of a member 53 placed on a principal surface 65 of the third adhesive layer 52, the principal surface 65 being farther from the protective membrane 2.

When placed on the principal surface 65, the member 53 has a low-adhesive face and/or a non-adhesive face on a face being the placement face 60. An adhesive layer may not be formed on the face being the placement face 60 of the member 53. The member 53 may be formed of a low-adhesive material and/or a non-adhesive material. The low-adhesive material has lower adhesiveness than the adhesiveness of the material forming the other portion 62 of the placement face 60. The member 53 is, for example, a film. The film forming the member 53 can have the same configuration as that of the substrate film 3 of the first protective cover member 1, except for the shape. The member 53 may be formed of a heat-resistant material. Specific examples of the heat-resistant material are those described above in the description of the protective membrane 2. The thickness of the member 53 is, for example, 5 to 100 μm.

Figure 9A:
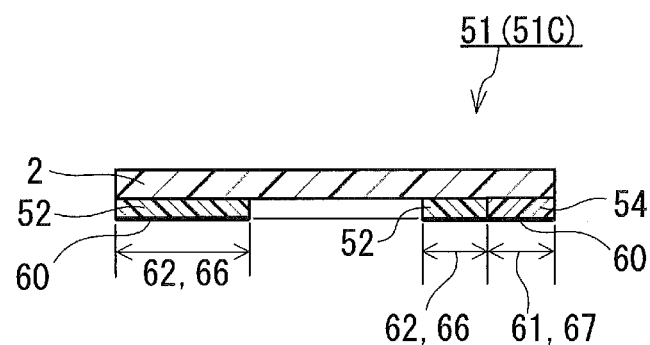
FIG. 9A is a cross-sectional view schematically showing yet another example of the second protective cover member.
Figure 9B:
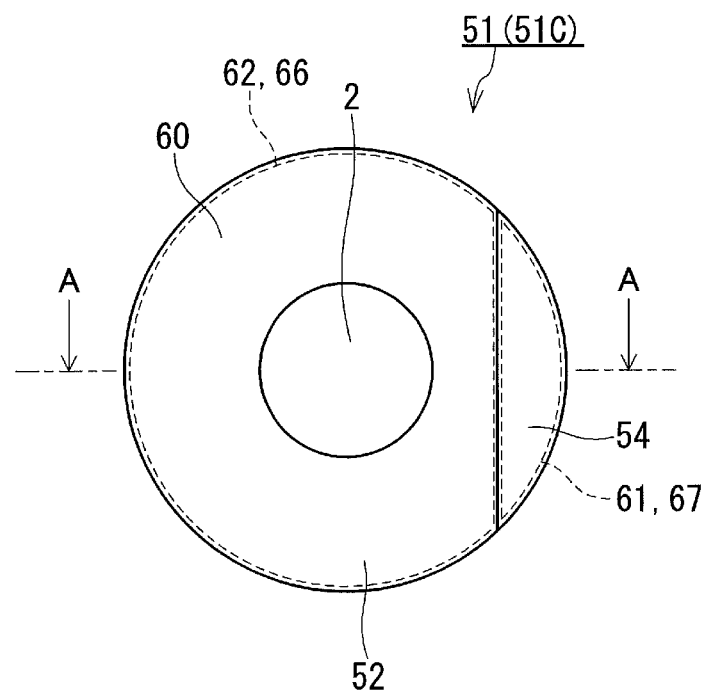
FIG. 9B is a plan view of the protective cover member of FIG. 9A viewed from the third adhesive layer 52 side.

In a protective cover member 51 (51C) shown in FIGS. 9A and 9B, when viewed perpendicular to a principal surface of the protective membrane 2, the third adhesive layer 52 is placed to overlap a partial region 66 of the protective membrane 2, a member 54 that is different from the third adhesive layer 52 is placed to overlap another partial region 67 of the protective membrane 2, and the portion 61 is formed of the member 54. Except for the above, the protective cover member 51 (51C) has the same configuration as that of the protective cover member 51A. The placement face 60 shown in FIGS. 9A and 9B is formed of the third adhesive layer 52 and the member 54. The placement face 60 may be formed of the third adhesive layer 52, the member 54, and an additional member.

The member 54 can have the same configuration as that of the member 53. The thickness of the member 54 is, for example, 5 to 100 μm. The thickness of the member 54 may be the same as that of the third adhesive layer 52.

Figure 10:
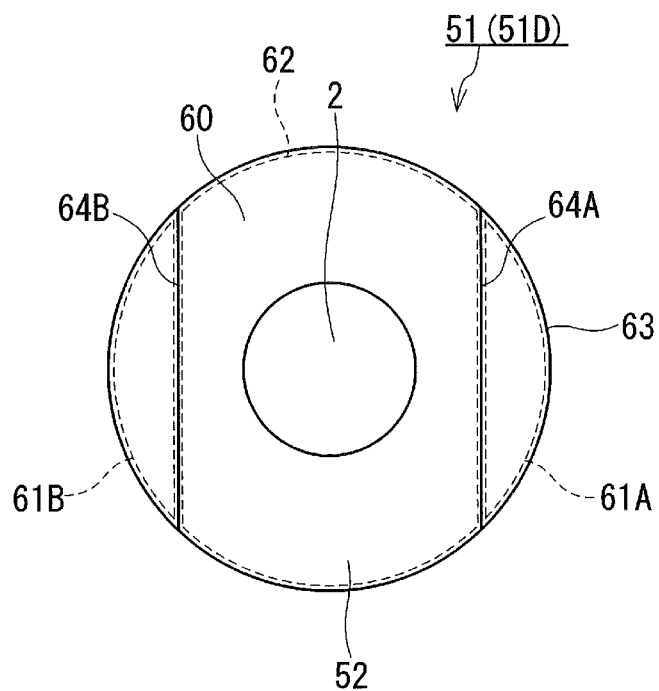
FIG. 10 is a plan view schematically showing a yet another example of the second protective cover member.

A protective cover member 51 (51D) shown in FIG. 10 has the same configuration as that of the protective cover member 51A, except that the number of portions 61 and the placement of the portion 61 are different. The placement face 60 of the protective cover member 51D has two portions 61 (61A and 61B). The shape of each of the portions 61A and 61B is the same as that of the portion 61 of the protective cover member 51A. The portions 61A and 61B face each other with a center of the protective cover member 51D in between. The protective cover member 51D can be removed more smoothly from both the portion 61A side and the portion 61B side.

Figure 11:
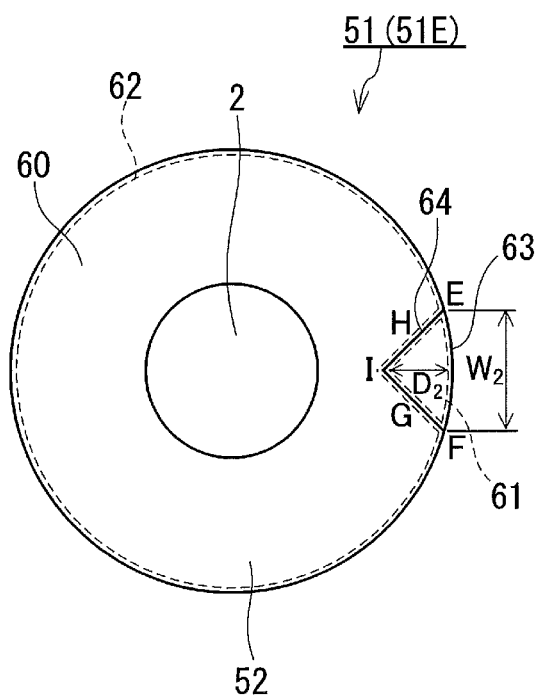
FIG. 11 is a plan view schematically showing an example of the second protective cover member other than the above examples.

A protective cover member 51 (51E) shown in FIG. 11 has the same configuration as that of the protective cover member 51A, except that the shape of the portion 61 is different. When viewed in the laminating direction, the portion 61 of the protective cover member 51E is surrounded by the part E-F of the outer perimeter 63 of the placement face 60 and the line 64 connecting both ends (E, F) of the part E-F and composed of two line segments (H, G) respectively extending inward from the ends (E, F) to intersect with each other. Each of the line segments (H, G) corresponds to a portion of a side extending from one vertex I of a polygon. The polygon is a square or a rectangle, and an angle EIF at which the line segments (H, G) intersect is about 90°. However, the shape of the polygon is not limited to a square and a rectangle, and the angle EIF may not be 90°.

The protective cover members 51A to 51E each have the shape of a circle when viewed in the laminating direction. However, the shape of the protective cover member 51 is not limited to the above example and may be, for example, a polygon such as a square or a rectangle or an ellipse when viewed in the laminating direction. The polygon may be a regular polygon such as a regular triangle, a regular pentagon, a regular hexagon, a regular heptagon, or a regular octagon. The corners of the polygon may be rounded.

Figure 12:
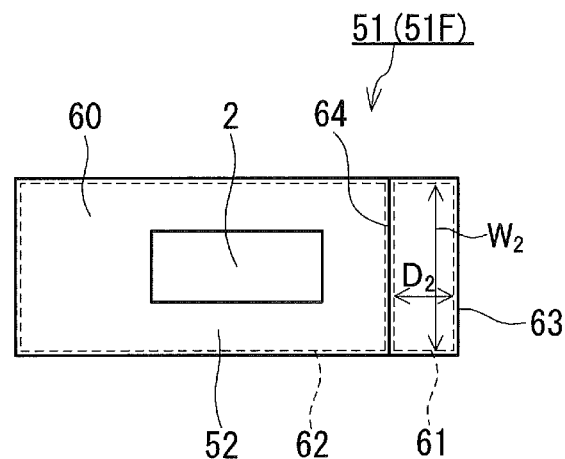
FIG. 12 is a plan view schematically showing an example of the second protective cover member other than the above examples.

FIG. 12 shows an example of the protective cover member 51 having a rectangular shape. A protective cover member 51F shown in FIG. 12 has the same configuration as that of the protective cover member 51A, except that the shape thereof is a rectangle when viewed in the laminating direction. The portion 61 of the protective cover member 51F is rectangular when viewed in the laminating direction.

The line 64 that is a straight line extends along a short side of the protective cover member 51F when viewed in the laminating direction. The shape of the portion 61 is not limited to this example. The line 64 may be a straight line not parallel to the above short side or may not be a straight line (may be, for example, a curved line) when viewed in the laminating direction.

The protective cover member 51 may include an optional layer other than those described above as long as the effects of the present invention can be obtained.

Figure 13:
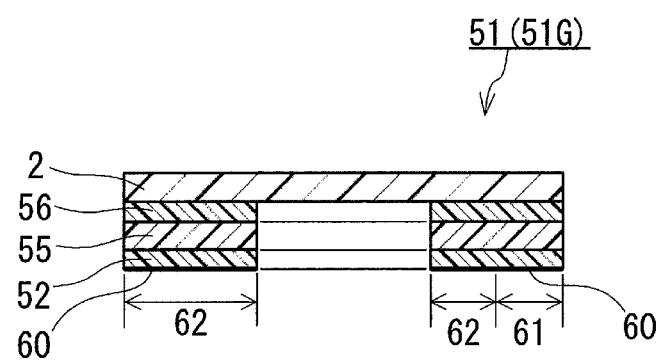
FIG. 13 is a cross-sectional schematically showing an example of the second protective cover member other than the above examples.

FIG. 13 shows an example of the protective cover member 51 including a layer other than those described above. A laminate of a protective cover member 51G shown in FIG. 13 further includes a substrate film 55 and a fourth adhesive layer 56. The substrate film 55 is joined to the protective membrane 2 by the fourth adhesive layer 56. The third adhesive layer 52 is provided on a face of the substrate film 55, the face being farther from the protective membrane 2. The substrate film 55 is positioned between the protective membrane 2 and the third adhesive layer 52. The protective membrane 2 is reinforced with the substrate film 55 for removing the protective cover member 51 from a face of an object.

Figure 14:
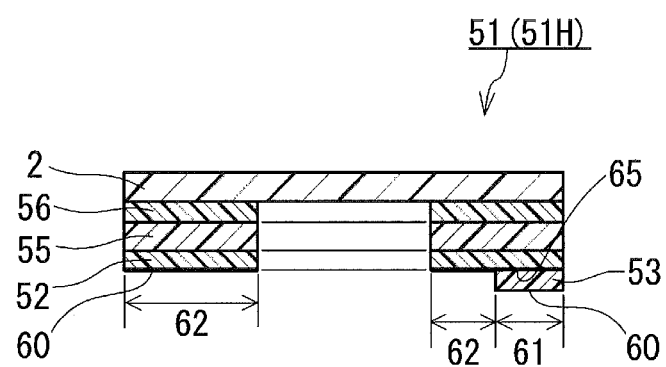
FIG. 14 is a cross-sectional schematically showing an example of the second protective cover member other than the above examples.

FIG. 14 shows another example of the protective cover member 51 including a layer other than those described above. A protective cover member 51H shown in FIG. 14 has the same configuration as that of the protective cover member 51G, except that the portion 61 is formed of the member 53 placed on the principal surface 65 of the third adhesive layer 52, the principal surface 65 being farther from the substrate film 55. Possible configurations of the member 53 are as described above.

The substrate film 55 can have the same configuration as that of the substrate film 3. The fourth adhesive layer 56 can have the same configuration as that of the second adhesive layer 4.

The range of the area of the protective cover member 51 can be the same as that of the area of the first protective cover member 1. However, the area of the protective cover member 51 may be larger depending on the type of an object on which the protective cover member 51 is placed. As is the case for the first protective cover member 1, the smaller the area of the protective cover member 51 is, the more difficult it is to remove the protective cover member 51.

In the case of the protective cover member 51 including the substrate film 55, as in the case of the protective cover member 1, the portion 61 can be deflected (curled) upward, for example, by treatment under high temperatures depending on the combination of the protective membrane 2 and the substrate film 55. In other words, the protective cover member 51 may have a configuration in which the portion 61 can be curled upward. The protective cover member 51 can be more reliably removed owing to the upward curl. Examples of the combination of the protective membrane 2 and the substrate film 55 are the same as those of the combination of the protective membrane 2 and the substrate film 3 in the protective cover member 1.

The degree of possible curling of the portion 61 of the protective cover member 51 may be 110% or more as represented by the curling rate and may be 130% or more, 200% or more, 250% or more, or even 290% or more when the member 51 is fixed to a surface of a stainless steel plate and subjected to heat treatment from 25° C. to 260° C. at a temperature increase rate of 1° C./sec. The curling rate can be determined by the following equation from maximum heights ($H_0$ before the heat treatment and $H_1$ after the heat treatment) of the portion 61 using the surface of the stainless steel plate as a reference surface: curling rate (%)=$H_1/H_0 \times 100$. The protective cover member 51 is fixed to the stainless steel plate using the third adhesive layer 52.

An object on which the protective cover member 51 can be placed, a face of such an object, treatment of an object on which the protective cover member 51 is placed, and the like are the same as those for the first protective cover member 1.

The protective cover member 51 can be produced, for example, by shape processing and lamination of the protective membrane 2 and the third adhesive layer 52, and formation of the portion 61 at the placement face 60.

The protective cover member 51, like the first protective cover member 1, can be supplied in a state of being placed on a release sheet such as a release paper or a release liner. Specific embodiments thereof are the same as those as for the first protective cover member 1.

Figure 15:
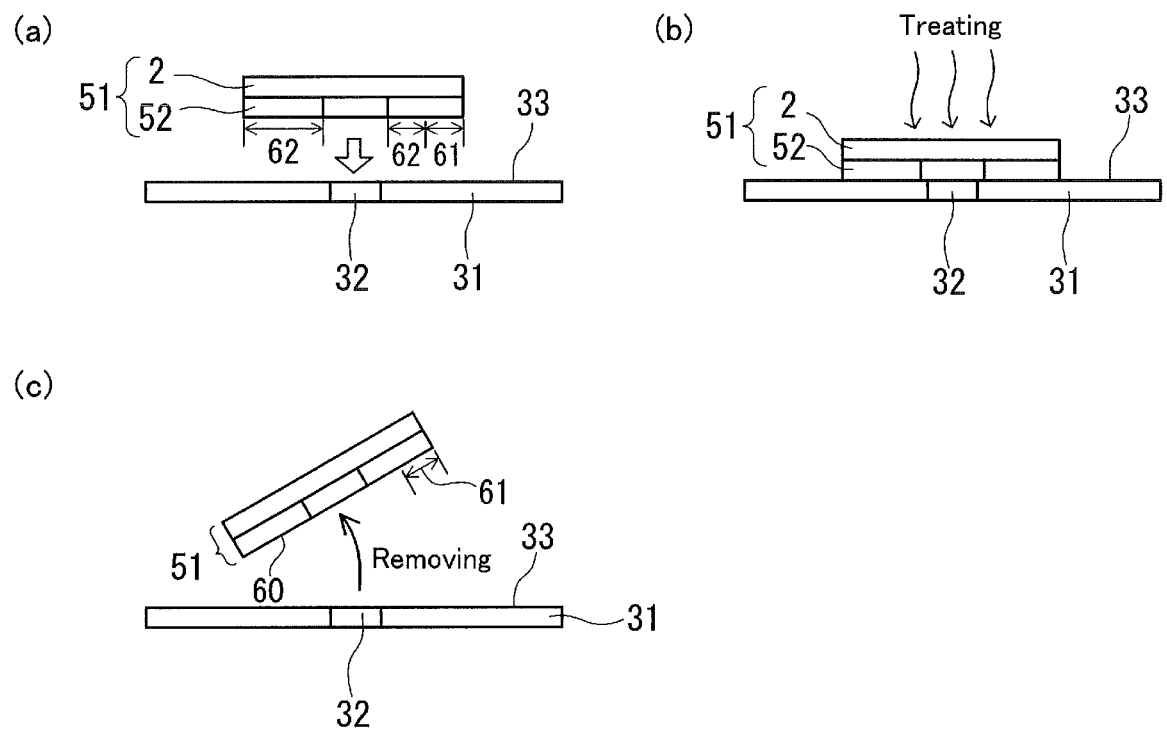
FIG. 15 is a process chart schematically showing an example of an embodiment of using the second protective cover member.

FIG. 15 shows an example of an embodiment of using the protective cover member 51.

As shown in FIG. 15 (*a*), the protective cover member 51 is placed on the surface 33 of the object 31 having the opening 32 such that the protective membrane 2 covers the opening 32. The protective cover member 51 is commonly placed such that the third adhesive layer 52 does not overlap the opening 32 when viewed in the laminating direction. Next, the object 31 on which the protective cover member 51 is placed is subjected to a given treatment (FIG. 15 (*b*)). After the treatment, the protective cover member 51 is removed from the surface 33 (FIG. 15 (*c*)). The protective cover member 51 can be removed from the portion 61 side of the placement face 60 of the protective cover member 51.

As is the case for the first protective cover member 1, the embodiment of using the protective cover member 51 is not limited to the above example.

The present disclosure discloses second protective cover members shown in the following items α to ζ.

[α]

A protective cover member configured to be placed on a face of an object to prevent a foreign matter from entering an opening of the face, the protective cover member including a laminate including:

a protective membrane having a shape configured to cover the opening when the protective cover member is placed on the face;

an adhesive layer (the third adhesive layer) configured to fix the protective cover member to the face, wherein a portion of a placement face to be on the face is a low-adhesive face and/or a non-adhesive face, the placement face being included in the protective cover member.

[β]

The protective cover member according to α, wherein the portion of the placement face is a treated face where adhesiveness of the adhesive layer is decreased.

[γ]

The protective cover member according to α, wherein the portion of the placement face is formed of an additional member placed on a principal surface of the adhesive layer, the principal surface being farther from the protective membrane.

[δ]

The protective cover member according to α, wherein when viewed perpendicular to a principal surface of the protective membrane, the adhesive layer is placed to overlap a partial region of the protective membrane, an additional member that is different from the adhesive layer is placed to overlap another partial region of the protective membrane, and the portion of the placement face is formed of the additional member.

[ε]

The protective cover member according to γ or δ, wherein the additional member is a film.

[ζ]

The protective cover member according to any one of α to ε, wherein the portion of the placement face is surrounded by a part of an outer perimeter of the placement face and a line connecting both ends of the part when viewed in a laminating direction of the laminate.

[Member Supplying Sheet]

Figure 16:
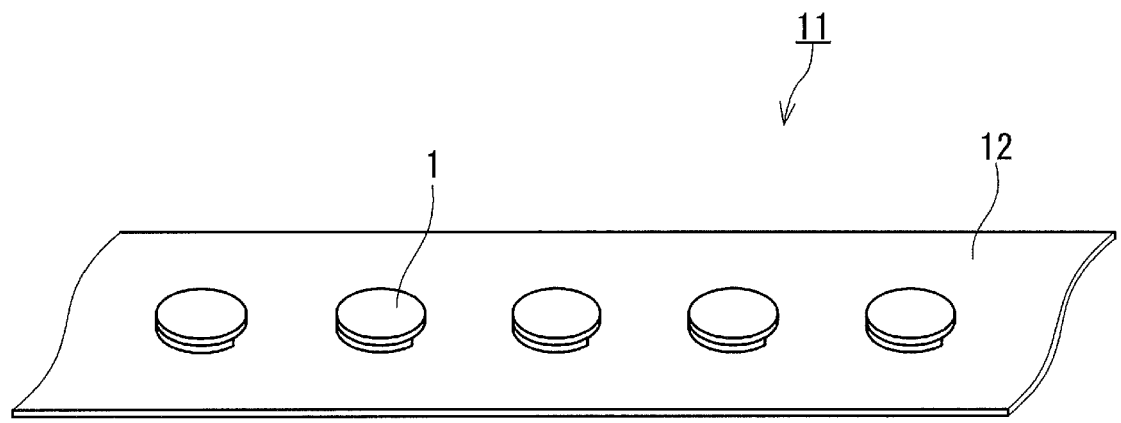
FIG. 16 is a perspective view schematically showing an example of a member supplying sheet of the present invention.

FIG. 16 shows an example of a member supplying sheet of the present invention. A member supplying sheet 11 shown in FIG. 16 includes a substrate sheet 12 and two or more protective cover members 1 placed on the substrate sheet 12. The member supplying sheet 11 is a sheet for supplying the protective cover member 1. With the use of the member supplying sheet 11, the protective cover member 1 can be effectively supplied, for example, in a step of placing the member 1 on a face of an object.

In an example shown in FIG. 16, two or more protective cover members 1 are placed on the substrate sheet 12. The number of the protective cover members 1 placed on the substrate sheet 12 may be one.

Examples of the material forming the substrate sheet 12 include paper, a metal, a resin, and a composite material thereof. Examples of the metal include aluminum and stainless steel. Examples of the resin include a polyester such as PET and a polyolefin such as polyethylene and polypropylene. However, the material forming the substrate sheet 12 is not limited to these examples.

The protective cover member 1 may be placed on the substrate sheet 12 with an adhesive layer (for example, the first adhesive layer 5) of the member 1 interposed therebetween. In this case, a placement face of the substrate sheet 12 on which the member 1 is placed may be subjected to release treatment for improving ease of release from the substrate sheet 12. The release treatment can be performed by a known method.

The protective cover member 1 may be placed on the substrate sheet 12 with an adhesive layer, typically a low-adhesive layer, therebetween, the adhesive layer being provided on the placement face of the substrate sheet 12 on which the protective cover member 1 is placed.

The thickness of the substrate sheet 12 is, for example, 1 to 200 μm.

The member supplying sheet 11 and the substrate sheet 12 shown in FIG. 16 are strip-shaped. The plurality of protective cover members 1 are placed in one direction (a direction along which the substrate sheet 12 extends) in series on the strip-shaped substrate sheet 12. However, the shape of the member supplying sheet 11, the shape of the substrate sheet 12, and the way of placing the protective cover members 1 on the substrate sheet 12 are not limited to this example. For example, the member supplying sheet 11 and/or the substrate sheet 12 may be a sheet cut into any of various shapes, for example, a polygon such as a rectangle or a square, a circle, and an oval. In this case, when viewed perpendicularly to the placement face, the plurality of protective cover members 1 may be placed in a staggered pattern or may be regularly placed such that a center of each protective cover member 1 is at an intersection (lattice point) of a virtual lattice on the placement face. Examples of the lattice include a square lattice, an orthorhombic lattice, and a rhombic lattice. The strip-shaped member supplying sheet 11 may be a wound body (reel) wound around a winding core. The center of the protective cover member 1 can be determined as a center of gravity of the shape of the member 1 when the surface of the substrate sheet 12 is viewed perpendicularly.

The member supplying sheet 11 can be produced by placing the protective cover member 1 on the substrate sheet 12.

The protective cover member placed on the substrate sheet 12 may be the second protective cover member 51 instead of the first protective cover member 1. Whether the protective cover member placed is the first protective cover member 1 or the second protective cover member 51 does not affect a possible embodiment of the member supplying sheet of the present invention. Both the first protective cover member 1 and the second protective cover member 51 may be placed on the substrate sheet 12. The member supplying sheet of the present invention includes the substrate sheet 12 and at least one first protective cover member 1 and/or at least one second protective cover member 51 placed on the substrate sheet 12.

EXAMPLES

Hereinafter, the present invention will be described more specifically by way of examples. The present invention is not limited to embodiments shown in the following examples.

Protective films, substrate films, adhesive layers, and protective cover members produced or used in EXAMPLES will be described.

[Thickness]

Thicknesses of the protective membranes, the substrate films, and the adhesive layers were each determined as an average of values measured at three measurement points using a dial thickness gauge (manufactured by Mitutoyo Corporation; diameter Φ of measurement terminal=10 mm). A measurement temperature was 25±5° C., and a measurement humidity was 65±20% RH.

[Dimensions]

Dimensions (the depths $D_1$, $D_2$, and $D_3$ and the widths $W_1$, $W_2$, and $W_3$) of the protective cover members were measured and determined using a measuring projector (PJ-H30 manufactured by Mitutoyo Corporation). A measurement temperature was 25±5° C., and a measurement humidity was 65±20% RH. Areas $A_1$, $A_2$, and $A_3$ were calculated from the depths and the widths (area A=depth D×width W) determined.

[Linear Expansion Coefficient]

Linear expansion coefficients α (160-200° C.) of the protective membranes and the substrate films were evaluated by thermo-mechanical analysis (TMA) using a thermal analyzer (TMA 4000 SA manufactured by NETZSCH Japan K.K.). Specimens had the shape of a rectangle having a width of 4 mm and a length of 25 mm. Each of the prepared specimen was set in the thermal analyzer and was then heated from 25° C. to 260° C. at a temperature increase rate of 10° C./min under a constant tensile load (0.5 gf) applied in a longitudinal direction of the specimen to obtain a TMA curve (horizontal axis: temperature; vertical axis: length of specimen), from which a linear expansion coefficient of the specimen was calculated by the following equation. A distance between chucks used to set the specimen was 20 mm. An average of linear expansion coefficients measured in longitudinal directions of the specimen, specifically MD and TD directions of the protective membrane or the substrate film of which the specimen was made, was defined as the linear expansion coefficient α of the protective membrane or the substrate film. In the following equation, $T_1$ is 160° C., $T_2$ is 200° C., La is an initial length of the specimen, $L_1$ is a length of the specimen at the temperature $T_1$, $L_2$ is a length of the specimen at the temperature $T_2$.

$$\alpha = \frac{\Delta L}{L_0 \Delta T} = \frac{L_2 - L_1}{L_0 (T_2 - T_1)}$$

[Air Permeability]

The air permeability in the thickness direction of each protective membrane was determined as Gurley air permeability according to Method B (Gurley method) of air permeability measurement specified in JIS L 1096.

[Curling Rate]

The curling rate which is a degree of deflection (curing) of a partial region or a portion of the protective cover member in a direction (upward) away from a face of an object was evaluated as follows, the deflection being caused by heat treatment of the protective cover member placed on the face of the object.

Each protective cover member produced was fixed to a surface of a stainless steel plate with an adhesive layer of the protective cover member interposed therebetween, the adhesive layer having an exposed face positioned far from the protective membrane. Next, the protective cover member on the stainless steel plate was put in a static reflow furnace (SAR-500A manufactured by Okuhara Electric Co., Ltd.) and subjected to heat treatment from 25° C. to 260° C. at a temperature increase rate of 1° C./sec. The degree of curling of a partial region or a portion as described above was observed before and after the heat treatment from a side of the protective cover member using a digital microscope (P-MFSC manufactured by Nikon Corporation). From a microscopic image obtained, maximum heights (before the heat treatment: $H_0$; after the heat treatment: $H_1$) of a curling region (curling portion) of the protective cover member was determined using the surface of the stainless steel plate as a reference surface, and the curling rate of the protective cover member was calculated by the following equation. For protective cover members of Comparative Examples 1 and 2, no upward deflected region or portion was formed by the above heat treatment. Because of $H_0=H_1$, the curling rates of the protective cover members of Comparative Examples 1 and 2 were 100%.

Curling rate (%)=$H_1/H_0 \times 100$

[Peelability]

Peelability of each protective cover member was evaluated as follows. Each protective cover member produced was fixed to a surface of a polychlorinated biphenyl plate with an adhesive layer of the protective cover member interposed therebetween, the adhesive layer having an exposed face positioned far from the protective membrane. Next, the protective cover member on the polychlorinated biphenyl plate was put in a static reflow furnace (SAR-500A manufactured by Okuhara Electric Co., Ltd.) and subjected to heat treatment from 25° C. to 260° C. at a temperature increase rate of 1° C./sec. Then, after the protective cover member was left to cool to 25° C., the protective cover member was peeled off and removed from the polychlorinated biphenyl plate by holding the member with metallic tweezers having a tip with a width of 1 mm. Whether the peeling damaged the polychlorinated biphenyl surface to which the member had been fixed was visually checked. The releasability was rated as good (o) when the surface was not damaged, and the releasability was rated as poor (x) when the surface was damaged. Protective cover members of Examples 1 to 5 were peeled off by holding the outward protruding region of the first portion 8A. A protective cover member of Example 6 was peeled off by holding the protective membrane and the portion 61. The protective cover member of Comparative Example 1, which do not have the first portion 8A and the portion 61, was peeled off by holding a side surface of the member. An attempt to peel off the protective cover member of Comparative Example 2 was made by holding the member at an outward protruding portion of a protective membrane.

[Preparation of Protective Membrane]

A stretched porous PTFE membrane A was prepared as a protective membrane in the following manner. An amount of 100 parts by weight of a PTFE fine powder (POLYFLON PTFE F-104 manufactured by DAIKIN INDUSTRIES, LTD.) and 20 parts by weight of n-dodecane (manufactured by Japan energy Inc.) as a shaping aid were uniformly mixed to obtain a mixture, which was compressed using a cylinder and then formed into a sheet-shaped mixture by ram extrusion molding. Next, the sheet-shaped mixture was passed between a pair of metallic rolls to be rolled to a thickness of 0.15 mm, and was then heated at 150° C. to remove the shaping aid and form a strip-shaped PTFE sheet body. Subsequently, the sheet body formed was stretched at a stretching temperature of 360° C. and a stretching ratio of 10 in a longitudinal direction and then stretched at stretching temperature of 150° C. and at a stretching ratio of 10 in a width direction to obtain the stretched porous PTFE membrane A. The stretched porous PTFE membrane A had a thickness of 25 μm, an air permeability, as represented by Gurley air permeability, of 0.2 sec/100 mL in a thickness direction, and a linear expansion coefficient of $-393 \times 10^{-6}/°$ C.

A stretched porous PTFE membrane B was prepared as another protective membrane in the following manner. To a PTFE dispersion (concentration of PTFE powder: 40 weight %; average particle diameter of PTFE powder: 0.2 μm; containing a nonionic surfactant in an amount of 6 parts by weight with respect to 100 parts by weight of PTFE) was added 1 part by weight of a fluorine-based surfactant (MEGAFACE F-142D manufactured by DIC CORPORATION) with respect to 100 parts by weight of PTFE. Next, a long polyimide film (thickness: 125 μm) was immersed in and pulled up from the PTFE dispersion to form an applied film formed of the PTFE dispersion on the polyimide film. The thickness of the applied film was controlled to 20 μm using a measuring bar. Subsequently, the applied film was heated at 100° C. for one minute and then at 390° C. for another one minute to evaporate and remove water contained in the dispersion and to bind the remaining PTFE particles to each other. A PTFE membrane was thus obtained. After the above process of immersion and heating was repeated two more times, the PTFE membrane (thickness: 25 μm) was peeled off from the polyimide film. Next, the PTFE membrane was stretched at a stretching ratio of 2 in a width direction using a tenter-type stretching machine. The PTFE membrane was further rolled at a rolling ratio of 2.5 in a longitudinal direction. The stretched porous PTFE membrane B was obtained in this manner. A temperature pf the rolls of a roll calendering apparatus was 170° C. The stretching temperature was 170° C. The stretched porous PTFE membrane B had a thickness of 10 μm, an air permeability, as represented by Gurley air permeability, of 100 sec/100 mL in a thickness direction, and a linear expansion coefficient of $-750 \times 10^{-6}/°$ C.

[Preparation of Substrate Film]

A polyimide film (Kapton manufactured by DU PONT-TORAY CO., LTD.) was prepared as a substrate film. The substrate film had a thickness of 25 μm and a linear expansion coefficient of $14 \times 10^{-6} 1°$ C.

Example 1

The stretched porous PTFE membrane A and the substrate film were joined using a silicone adhesive (SH4280 manufactured by Dow Toray Co., Ltd.; curable by a peroxide; content of a peroxide: 1.2 parts by weight) to form a laminate. The curing conditions of the silicone adhesive were 200° C. and three minutes. An adhesive layer (second adhesive layer 4) formed of the silicone adhesive had a thickness of 25 μm. Next, the laminate was cut into a rectangular having a width of 10 mm and a length of 100 mm to form the first portion 8A. Then, a rectangular having a width of 10 mm and a length of 90 mm and cut out of a double-sided adhesive tape (No. 585 manufactured by NITTO DENKO CORPORATION; thickness: 50 μm) was joined as the first adhesive layer 5 to the substrate film. The first adhesive layer 5 was joined such that one short side and two long sides of the first portion 8A and those of the first adhesive layer 5 coincided. A rectangular protective cover member (the outward protruding region of the first portion 8A thereof had a width $W_1$ of 10 mm, a depth $D_1$ of 10 mm, and an area $A_1$ of 100 mm$^2$) as shown in FIGS. 4A and 4B was obtained in this manner. While the protective membrane used had air permeability in the thickness direction, the second adhesive layer 4, the substrate film, and the first adhesive layer 5 were in shapes configured to have no air permeability in the thickness direction because the purpose was to evaluate the curling rate and the releasability of the protective cover member. Hence, the protective cover member produced had no air permeability in the thickness direction (the same can be said in Examples and Comparative Examples below).

Example 2

A laminate produced in the same manner as in Example 1 was cut into a rectangle having a width of 5 mm and a length of 50 mm to form the first portion 8A. Then, a rectangular having a width of 5 mm and a length of 45 mm and cut out of a double-sided adhesive tape (No. 585 manufactured by NITTO DENKO CORPORATION; thickness: 50 μm) was joined as the first adhesive layer 5 to the substrate film. The first adhesive layer 5 was joined such that one short side and two long sides of the first portion 8A and those of the first adhesive layer 5 coincided. A rectangular protective cover member (the outward protruding region of the first portion 8A thereof had a width $W_1$ of 5 mm, a depth $D_1$ of 5 mm, and an area $A_1$ of 25 mm$^2$) as shown in FIGS. 4A and 4B was obtained in this manner.

Example 3

A laminate produced in the same manner as in Example 1 was cut into a rectangle having a width of 2.5 mm and a length of 25 mm to form the first portion 8A. Then, a rectangular having a width of 2.5 mm and a length of 24.5 mm and cut out of a double-sided adhesive tape (No. 585 manufactured by NITTO DENKO CORPORATION; thickness: 50 μm) was joined as the first adhesive layer 5 to the substrate film. The first adhesive layer 5 was joined such that one short side and two long sides of the first portion 8A and those of the first adhesive layer 5 coincided. A rectangular protective cover member (the outward protruding region of the first portion 8A thereof had a width $W_1$ of 2.5 mm, a depth $D_1$ of 0.5 mm, and an area $A_1$ of 1.25 mm$^2$) as shown in FIGS. 4A and 4B was obtained in this manner.

Example 4

A laminate produced in the same manner as in Example 1 was cut into a rectangle having a width of 1.0 mm and a length of 10 mm to form the first portion 8A. Then, a rectangular having a width of 1.0 mm and a length of 9.5 mm and cut out of a double-sided adhesive tape (No. 585 manufactured by NITTO DENKO CORPORATION; thickness: 50 μm) was joined as the first adhesive layer 5 to the substrate film. The first adhesive layer 5 was joined such that one short side and two long sides of the first portion 8A and those of the first adhesive layer 5 coincided. A rectangular protective cover member (the outward protruding region of the first portion 8A thereof had a width $W_1$ of 1.0 mm, a depth $D_1$ of 0.5 mm, and an area $A_1$ of 0.5 mm$^2$) as shown in FIGS. 4A and 4B was obtained in this manner.

Comparative Example 1

A laminate produced in the same manner as in Example 1 was cut into a rectangle having a width of 10 mm and a length of 100 mm. Then, a rectangular having a width of 10 mm and a length of 100 mm and cut out of a double-sided adhesive tape (No. 585 manufactured by NITTO DENKO CORPORATION; thickness: 50 μm) was joined as an adhesive layer to the substrate film. The adhesive layer was joined such that an outer perimeter of the laminate and an outer perimeter of the adhesive layer coincided when viewed in the laminating direction of the laminate. A rectangular protective cover member having no outward protruding region was obtained in this manner.

(Modification)

A laminate produced in the same manner as in Example 1 was cut into a rectangle having a width of 10 mm and a length of 100 mm. Then, a rectangular having a width of 10 mm and a length of 100 mm and cut out of a double-sided adhesive tape (No. 585 manufactured by NITTO DENKO CORPORATION; thickness: 50 μm) was joined as the third adhesive layer 52 to the substrate film. The third adhesive layer 52 was joined such that an outer perimeter of the laminate and an outer perimeter of the third adhesive layer 52 coincided when viewed in the laminating direction of the laminate. Next, an additional polyimide film (Kapton manufactured by DU PONT-TORAY CO., LTD.; thickness: 25 μm) having the shape of a 10 mm square was placed as the member 53 on an exposed face of the third adhesive layer 52. The polyimide film was placed such that three sides of the additional polyimide film and one short side and two long sides of the third adhesive layer 52 coincided. A rectangular protective cover member (the portion 61 thereof had a width $W_2$ of 10 mm, a depth $D_2$ of 10 mm, and an area $A_2$ of 100 mm$^2$), in which the portion 61 being a non-adhesive face was formed of the polyimide film serving as the member 53 on the adhesive face 60, as shown in FIG. 14 was obtained in this manner.

Comparative Example 2

Figure 17A:
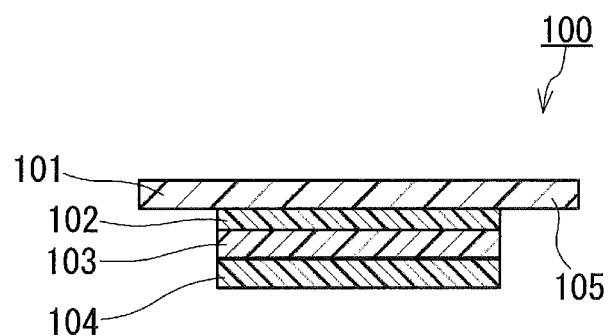
FIG. 17A is a cross-sectional view schematically showing a protective cover member produced in Comparative Example 2.
Figure 17B:
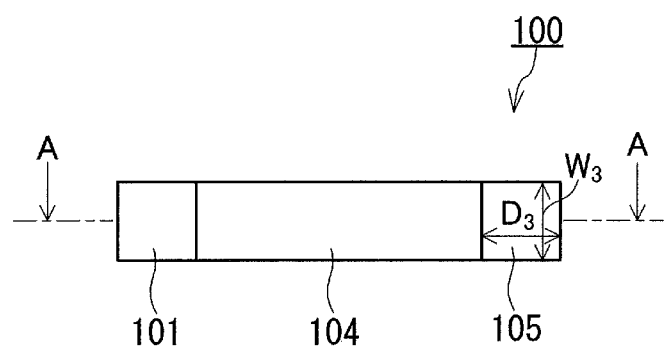
FIG. 17B is a plan view of the protective cover member of FIG. 17A viewed from an adhesive layer 104 side.

The stretched porous PTFE membrane A (a rectangle having a width of 10 mm and a length of 120 mm) serving as a protective membrane 101 was joined to one principal surface of a substrate film 103 (a rectangle having a width of 10 mm and a length of 100 mm) using a silicone adhesive as used in Example 1 to obtain a laminate. The curing conditions of the silicone adhesive were the same as those in Example 1. An adhesive layer 102 formed of the silicone adhesive had a thickness of 25 μm. Joining was performed such that a long side and a center of the substrate film 103 and those of the protective membrane 101 coincided when viewed in the laminating direction of the laminate. Then, a rectangular having a width of 10 mm and a length of 100 mm and cut out of a double-sided adhesive tape (No. 585 manufactured by NITTO DENKO CORPORATION; thickness: 50 μm) was joined as an adhesive layer 104 to the substrate film. The adhesive layer 104 was joined such that an outer perimeter of the substrate film 103 and an outer perimeter of the adhesive layer 104 coincided when viewed in the laminating direction. A protective cover member 100 (refer to FIGS. 17A and 17B) was obtained in this manner in which the protective membrane 101 included a portion 105 protruding outward with respect to the outer perimeters of the substrate film 103 and the adhesive layers 102 and 104 when viewed in the laminating direction. The protruding portion 105 of the protective membrane 101 thereof had a width $W_3$ of 10 mm, a depth $D_3$ of 10 mm, and an area $A_3$ of 100 mm$^2$.

Example 5

A rectangular protective cover member (the outward protruding region of the first portion 8A thereof had a width $W_1$ of 10 mm, a depth $D_1$ of 10 mm, and an area $A_1$ of 100 mm$^2$) as shown in FIGS. 4A and 4B was obtained in the same manner as in Example 1, except that the stretched porous PTFE membrane B was used as a protective membrane instead of the stretched porous PTFE membrane A.

Table 1 shows the evaluation results for the protective cover members produced.

TABLE 1

| | | Example | | | | | | Comparative Example | |
|---|---|---|---|---|---|---|---|---|---|
| | | 1 | 2 | 3 | 4 | 5 | Modification | 1 | 2 |
| Linear expansion coefficient ×10$^{-6}$/° C. | Protective membrane | −393 | −393 | −393 | −393 | −750 | −393 | −393 | −393 |
| | Substrate film | 14 | 14 | 14 | 14 | 14 | 14 | 14 | 14 |
| Protruding region or portion 61 | Width W (mm) | 10 | 5 | 2.5 | 1.0 | 10 | 10 | — | 10 |
| | Depth D (mm) | 10 | 5 | 0.5 | 0.5 | 10 | 10 | — | 10 |
| | W/D | 1.0 | 1.0 | 5.0 | 2.0 | 1.0 | 1.0 | — | 1.0 |
| | Area A (mm$^2$) | 100 | 25 | 1.25 | 0.5 | 100 | 100 | — | 100 |
| Curling rate (%) | | 389 | 260 | 137 | 114 | 456 | 290 | 100 | 100 |
| Peelability | | ○ | ○ | ○ | ○ | ○ | ○ | x | x*[1] |

*[1]Unable to be released because of cohesive failure of the protective membrane held.

As shown in Table 1, the peelability is able to be secured for the protective cover members of Examples and Modification. The larger the curling rate is, the better the peelability is. As far as the protective cover members of Examples are concerned, the curling rate is larger when the area of the outward protruding region of the first portion 8A and/or a difference between the linear expansion coefficients of the protective membrane and the substrate film is larger.

INDUSTRIAL APPLICABILITY

The protective cover member of the present invention can be used, for example, for production of a circuit board including a semiconductor device such as a MEMS device.

The invention claimed is:

1. A protective cover member configured to be placed on a face of an object to prevent a foreign matter from entering an opening of the face, the protective cover member comprising a laminate including:
a protective membrane having a shape configured to cover the opening in a state that the protective cover member is placed on the face;
a substrate film joined to the protective membrane; and
a first adhesive layer configured to fix the protective cover member to the face, wherein
an outer peripheral surface of the protective cover member has a step in a laminating direction of the laminate,
in the state that the protective cover member is placed on the face, a first portion of the protective cover member protrudes at the step more outward than a second portion of the protective cover member does, the first portion being positioned farther from the face than the step, the second portion being positioned closer to the face than the step, and
the protective membrane and the substrate film are positioned in the first portion, and
wherein, with respect to a plan view of the protective membrane, the step is provided to extend along only a portion of a perimeter of the first portion.

2. The protective cover member according to claim 1, wherein the protective membrane has air permeability in a thickness direction.

3. The protective cover member according to claim 1, wherein the protective membrane is formed of a heat-resistant material.

4. The protective cover member according to claim 1, wherein the protective membrane includes a stretched porous polytetrafluoroethylene membrane.

5. The protective cover member according to claim 1, wherein the substrate film is positioned between the protective membrane and the first adhesive layer.

6. The protective cover member according to claim 1, wherein the substrate film has an outer perimeter coinciding with an outer perimeter of the protective membrane as viewed in the laminating direction.

7. The protective cover member according to claim 1, wherein the substrate film is formed of a heat-resistant material.

8. The protective cover member according to claim 1, wherein the protective membrane and the substrate film are joined by a second adhesive layer.

9. The protective cover member according to claim 1, wherein the first adhesive layer is positioned in the second portion.

10. The protective cover member according to claim 1, wherein the first adhesive layer comprises a double-faced adhesive tape.

11. The protective cover member according to claim 1, wherein
the first portion is circular, elliptical, or regular polygonal as viewed in the laminating direction, and
an outer perimeter of the second portion is recessed inward with respect to an outer perimeter of the first portion to form the step.

12. The protective cover member according to claim 1, wherein the protective membrane has an area of 175 mm$^2$ or less.

13. A member supplying sheet comprising:
a substrate sheet; and
at least one protective cover member placed on the substrate sheet, wherein
the protective cover member is the protective cover member according to claim 1.

14. The protective cover member according to claim 1, further comprising:
the perimeter of the first portion being defined by a circle as viewed in the laminating direction of the laminate,
wherein the step is bounded by a segment of the circle, and
wherein the segment of the circle is defined by a chord that connects two points on the perimeter of the first portion.

15. The protective cover member according to claim 1, wherein
the step connects two points on the perimeter of the first portion such that the step is recessed inwardly of the outer peripheral surface of the protective cover member, as viewed in the laminating direction.

16. The protective cover member according to claim 1, wherein
the step linearly connects two points on the perimeter of the first portion such that the step is recessed inwardly of the outer peripheral surface the protective cover member, as viewed in the laminating direction.

17. The protective cover member according to claim 1, wherein
the step connects a first point and a second point on the perimeter of the first portion via a third point located inwardly of the outer peripheral surface of the protective cover member, as viewed in the laminating direction.

18. The protective cover member according to claim 17, wherein
the step includes a first straight line connecting the first point and the third point, and a second straight line connecting the second point and the third point.

* * * * *